United States Patent
Kohri et al.

(10) Patent No.: US 8,594,520 B2
(45) Date of Patent: Nov. 26, 2013

(54) IMAGE FORMING APPARATUS AND METHOD OF MONITORING IMAGE FORMING APPARATUS POWER CONSUMPTION

(75) Inventors: Yuusuke Kohri, Kanagawa (JP); Norikazu Okada, Kanagawa (JP)

(73) Assignee: Ricoh Company, Ltd., Toyko (JP)

(*) Notice: Subject to any disclaimer, the term of this patent is extended or adjusted under 35 U.S.C. 154(b) by 205 days.

(21) Appl. No.: 12/923,022

(22) Filed: Aug. 30, 2010

(65) Prior Publication Data

US 2011/0064431 A1 Mar. 17, 2011

(30) Foreign Application Priority Data

Sep. 14, 2009 (JP) .................. 2009-212016

(51) Int. Cl.
  *G03G 15/02* (2006.01)
(52) U.S. Cl.
  USPC .............................. 399/31; 399/44
(58) Field of Classification Search
  USPC .............. 399/12, 37, 44, 79, 88, 31
  See application file for complete search history.

(56) References Cited

U.S. PATENT DOCUMENTS

| | | | |
|---|---|---|---|
| 2007/0285738 A1 | 12/2007 | Kuroki et al. | |
| 2009/0129797 A1 | 5/2009 | Suzuki et al. | |

FOREIGN PATENT DOCUMENTS

| | | |
|---|---|---|
| JP | 2001-111781 | 4/2001 |
| JP | 2002-287584 | 10/2002 |
| JP | 2003-091218 | 3/2003 |
| JP | 2004-062399 | 2/2004 |
| JP | 2004-351812 | 12/2004 |
| JP | 2006-047398 | 2/2006 |
| JP | 2006-091609 | 4/2006 |
| JP | 2006-322761 | 11/2006 |
| JP | 2007-003720 | 1/2007 |
| JP | 2007-065599 | 3/2007 |
| JP | 2007-171796 | 7/2007 |
| JP | 2007-226037 | 9/2007 |
| JP | 2007-333803 | 12/2007 |
| JP | 2008-225047 | 9/2008 |
| JP | 2008-261826 | 10/2008 |
| JP | 2009-025526 | 2/2009 |
| JP | 2009-053612 | 3/2009 |
| JP | 2009-098264 | 5/2009 |
| JP | 2009-122179 | 6/2009 |

OTHER PUBLICATIONS

Machine translation of JP 2006/322761.*
Office Action for Corresponding Japanese Application No. 2009-212016 dated May 31, 2013.
Office Action for corresponding Japanese Application No. 2009-212016 dated Aug. 20, 2013.

\* cited by examiner

*Primary Examiner* — Walter L Lindsay, Jr.
*Assistant Examiner* — Barnabas Fekete
(74) *Attorney, Agent, or Firm* — Harness, Dickey & Pierce

(57) ABSTRACT

An image forming apparatus and a method of monitoring power consumption of the image forming apparatus are provided. For each one of parts of the image forming apparatus selected for monitoring, part-specific power consumption information is obtained based on accumulated operation amount information. The obtained part-specific power consumption information is used to generate power consumption information indicating an amount of electric power consumed by at least a portion of the image forming apparatus.

18 Claims, 17 Drawing Sheets

FIG. 5

| | USAGE OF EACH MODE | | | | |
|---|---|---|---|---|---|
| | WARM-UP MODE | COPY MODE | PRINT MODE | SCAN MODE | READY MODE | ENERGY SAVE MODE |
| XENON LAMP | LIGHT ONE TIME | LIGHT ONE TIME PER ONE-SHEET PRINT | LIGHT "0" TIME | LIGHT ONE TIME | LIGHT "0" TIME | LIGHT "0" TIME |

FIG. 6

| USAGE TIME (HOURS) | DC MOTOR POWER CONSUMPTION (W) |
|---|---|
| 0 | 100 |
| 300 | 102 |
| 800 | 104 |
| 1000 | 106 |
| 1300 | 108 |
| 2800 | 110 |
| 3000 | 115 |
| 3300 | 130 |
| 3800 | 140 |

FIG. 13

| MODE | INITIAL VALUE | UPPER LIMIT | CURRENT POWER |
|---|---|---|---|
| COPY MODE | 1200W | 1250W | 1272W |
| PRINT MODE | 1050W | 1100W | — |
| SCAN MODE | 450W | 490W | — |
| READY MODE | 250W | 270W | — |
| ENERGY SAVE MODE | 150W | 160W | — |
| SLEEP MODE | 20W | 25W | — |

FIG. 14

| PARTS | INITIAL VALUE, COST | COUNT METHOD | POWER-LIFE TABLE OR FORMULA | CURRENT LIFE | CURRENT POWER |
|---|---|---|---|---|---|
| XENON LAMP | 120W ¥10000 | NUMBER OF LIGHTING | A | 120000 TIMES | 150W |
| 7 MOTORS | 30W × 7 ¥5000 × 7 | NUMBER OF ROTATION | B | 4000 HOURS | 35W × 7 |
| BACKLIGHT | 20W ¥20000 | NUMBER OF POWER ON | C | 9000 HOURS | 23W |
| 2 HDD | 40W ¥20000 | NUMBER OF POWER ON | D | 8000 HOURS | 44W |
| TOTAL | 390W | — | — | — | 462W |

| PARTS | INITIAL VALUE, COST | COUNT METHOD | CURRENT LIFE | CURRENT POWER |
|---|---|---|---|---|
| XENON LAMP | 120W | NUMBER OF LIGHTING | 0 TIME | 120W |
| 7 MOTORS | 30W × 7 | NUMBER OF ROTATION | 4000 HOURS | 35W × 7 |
| BACKLIGHT | 20W | NUMBER OF POWER ON | 9000 HOURS | 23W |
| 2 HDD | 40W | NUMBER OF POWER ON | 8000 HOURS | 44W |
| TOTAL | 390W | — | — | 432W |

| MODE | INITIAL VALUE | UPPER LIMIT | CURRENT POWER |
|---|---|---|---|
| COPY MODE | 1200W | 1250W | 1242W |

FIG. 20

PARTS REPLACEMENT SIMULATION
PLEASE SELECT PARTS.
POWER CONSUMPTION AND COST AFTER
REPLACEMENT ARE CALCULATED.

SORT

REPLACEABLE PARTS

| PARTS | POWER | POWER INCREASE RATE | USAGE TIME | REMAINING LIFE | UNIT PRICE (YEN) |
|---|---|---|---|---|---|
| XENON LAMP | 120W | 0W | 0 TIME | 300000 TIMES | 10000 |
| HDD | 44W | 4W | 8000 HOURS | 11000 HOURS | 20000 |
| MOTOR 1 | 35W | 5W | 4000 HOURS | 6000 HOURS | 5000 |
| MOTOR 2 | 35W | 5W | 4000 HOURS | 6000 HOURS | 5000 |
| MOTOR 3 | 35W | 5W | 4000 HOURS | 6000 HOURS | 5000 |
| MOTOR 4 | 35W | 5W | 4000 HOURS | 6000 HOURS | 5000 |
| MOTOR 5 | 35W | 5W | 4000 HOURS | 6000 HOURS | 5000 |
| MOTOR 6 | 35W | 5W | 4000 HOURS | 6000 HOURS | 5000 |
| MOTOR 7 | 35W | 5W | 4000 HOURS | 6000 HOURS | 5000 |
| BACKLIGHT | 23W | 3W | 8000 HOURS | 11000 HOURS | 20000 |

POWER CONSUMPTION

| UPPER LIMIT | BEFORE REPLACE | AFTER REPLACED |
|---|---|---|
| 1250W | 1272W | 1242W |

PRICE
¥10000
(INCLUDING TAX)

CANCEL

FIG. 21

PARTS REPLACEMENT SIMULATION
PLEASE SELECT PARTS.
POWER CONSUMPTION AND COST AFTER
REPLACEMENT ARE CALCULATED.

SORT

REPLACEABLE PARTS

| PARTS | POWER | POWER INCREASE RATE | USAGE TIME | REMAINING LIFE | UNIT PRICE (YEN) |
|---|---|---|---|---|---|
| XENON LAMP | 120W | 0W | 0 TIME | 300000 TIMES | 10000 |
| HDD | 44W | 4W | 8000 HOURS | 11000 HOURS | 20000 |
| MOTOR 1 | 30W | 0W | 0 HOURS | 10000 HOURS | 5000 |
| MOTOR 2 | 35W | 5W | 4000 HOURS | 6000 HOURS | 5000 |
| MOTOR 3 | 35W | 5W | 4000 HOURS | 6000 HOURS | 5000 |
| MOTOR 4 | 35W | 5W | 4000 HOURS | 6000 HOURS | 5000 |
| MOTOR 5 | 35W | 5W | 4000 HOURS | 6000 HOURS | 5000 |
| MOTOR 6 | 35W | 5W | 4000 HOURS | 6000 HOURS | 5000 |
| MOTOR 7 | 35W | 5W | 4000 HOURS | 6000 HOURS | 5000 |
| BACKLIGHT | 23W | 3W | 8000 HOURS | 11000 HOURS | 20000 |

POWER CONSUMPTION

| UPPER LIMIT | BEFORE REPLACE | AFTER REPLACED |
|---|---|---|
| 1250W | 1272W | 1237W |

PRICE
¥15000
(INCLUDING TAX)

CANCEL

FIG. 22

PARTS REPLACEMENT SIMULATION
PLEASE SELECT PARTS.
POWER CONSUMPTION AND COST AFTER REPLACEMENT ARE CALCULATED.

(SORT) 613

REPLACEABLE PARTS 612

| PARTS | POWER | POWER INCREASE RATE | USAGE TIME | REMAINING LIFE | UNIT PRICE (YEN) |
|---|---|---|---|---|---|
| XENON LAMP | 120W | 0W | 0 TIME | 300000 TIMES | 10000 |
| HDD | 44W | 4W | 8000 HOURS | 11000 HOURS | 20000 |
| MOTOR 1 | 30W | 0W | 0 HOURS | 10000 HOURS | 5000 |
| MOTOR 2 | 35W | 5W | 4000 HOURS | 6000 HOURS | 5000 |
| MOTOR 3 | 35W | 5W | 4000 HOURS | 6000 HOURS | 5000 |
| MOTOR 4 | 35W | 5W | 4000 HOURS | 6000 HOURS | 5000 |
| MOTOR 5 | 35W | 5W | 4000 HOURS | 6000 HOURS | 5000 |
| MOTOR 6 | 35W | 5W | 4000 HOURS | 6000 HOURS | 5000 |
| MOTOR 7 | 35W | 5W | 4000 HOURS | 6000 HOURS | 5000 |
| BACKLIGHT | 23W | 3W | 9000 HOURS | 11000 HOURS | 2000 |

POWER CONSUMPTION 611

PRICE
¥15000 (INCLUDING TAX) — 615

REPLACED PARTS LIST
① XENON LAMP
② MOTOR 1 — 617

(CANCEL) 614

FIG. 24

| ENVIRONMENTAL FACTOR | TEMPERATURE | HUMIDITY | NUMBER OF YEARS USED | OTHER |
|---|---|---|---|---|
| +3 | 35°C≤T | 80%≤H | 5 YEARS≤U | VERY HIGH |
| +2 | 30°C≤T<35°C | 70%≤H<80% | 3 YEARS≤U<5 YEARS | HIGH |
| +1 | 25°C≤T<30°C | 60%≤H<70% | 1 YEAR≤U<3 YEARS | RELATIVELY HIGH |
| 0 | T<25°C | H<60% | U<1 YEAR | NORMAL |

FIG. 25

| CORRECTION COEFFICIENT | TOTAL |
|---|---|
| USAGE × 1.20 | 10 – |
| USAGE × 1.15 | 7 – 9 |
| USAGE × 1.10 | 4 – 6 |
| USAGE × 1.05 | 1 – 3 |
| USAGE × 1.00 | 0 |

IMAGE FORMING APPARATUS AND METHOD OF MONITORING IMAGE FORMING APPARATUS POWER CONSUMPTION

CROSS-REFERENCE TO RELATED APPLICATIONS

This patent application is based on and claims priority pursuant to 35 U.S.C. §119 to Japanese Patent Application No. 2009-212016, filed on Sep. 14, 2009, in the Japanese Patent Office, the entire disclosure of which is hereby incorporated herein by reference.

FIELD OF THE INVENTION

The present invention generally relates to an image forming apparatus capable of monitoring electric power consumption of the image forming apparatus, and a method of monitoring electric power consumption of the image forming apparatus.

BACKGROUND

Recently, products such as image forming apparatuses are evaluated in terms of their potential for carbon dioxide emission reduction. In the case of image forming apparatuses, a large proportion of carbon dioxide emitted throughout the apparatus lifecycle is emitted on site as the image forming apparatus consumes electric power to perform image formation. In order to measure electric power consumption of the image forming apparatus at the user site, a power consumption measuring device may be connected to the image forming apparatus as disclosed, for example, in Japanese Patent Application Publication No. 2008-261826-A.

Not surprisingly, the older image forming apparatuses tend to consume more electric power due to degradation of parts constituting the image forming apparatus. For this reason, if the degraded part can be identified and replaced with a new one, the increase in power consumption of the image forming apparatus over time may also be suppressed, resulting in carbon dioxide emission reduction.

In view of the above, there is a need for monitoring part-specific power consumption of the image forming apparatus by specific part of the image forming apparatus, which the power consumption measuring device disclosed in JP-2008-261826-A is unable to do.

SUMMARY

Example embodiments of the present invention include an image forming apparatus that monitors the change in power consumption for a specific part of the image forming apparatus subjected for monitoring over time, and further obtains information regarding the power consumption of the specific part of the image forming apparatus.

Based on the information regarding the power consumption of the specific part of the image forming apparatus, the image forming apparatus further generates information regarding power consumption of the entire image forming apparatus such as power consumption of the entire image forming apparatus for a specific operation mode.

Example embodiments of the present invention include a method of monitoring the change in power consumption for a specific part of the image forming apparatus subjected for monitoring over time, and obtaining information regarding the power consumption of the specific part of the image forming apparatus.

The above-described method of monitoring may be provided in the form of a computer program or a recording medium storing the computer program. Alternatively, the above-described method of monitoring may be performed by any desired apparatus other than the image forming apparatus subjected for monitoring.

BRIEF DESCRIPTION OF THE DRAWINGS

A more complete appreciation of the disclosure and many of the attendant advantages and features thereof can be readily obtained and understood from the following detailed description with reference to the accompanying drawings, wherein:

FIG. 5 is a table storing information indicating a number of times the Xenon lamp is lighted for each of a plurality operation modes of the image forming apparatus of FIG. 1;

FIG. 6 is a table storing an accumulated time during which the DC motor is driven and electric power consumption of the DC motor in a corresponding manner;

FIG. 13 is a table storing information regarding power consumption of the image forming apparatus of FIG. 1 by operation mode;

FIG. 14 is a table storing power consumption information of the image forming apparatus of FIG. 1 for the copy mode;

FIG. 20 is an example parts replacement simulation screen displayed by the image forming apparatus of FIG. 1;

FIG. 21 is an example parts replacement simulation screen displayed by the image forming apparatus of FIG. 1;

FIG. 22 is an example parts replacement simulation screen displayed by the image forming apparatus of FIG. 1;

FIG. 24 is a table storing the value of an environmental factor assigned to each one of a plurality of environmental conditions;

FIG. 25 is a table storing a correction coefficient of accumulated operation amount information and a total value of environmental factors in a corresponding manner.

Figure 1:
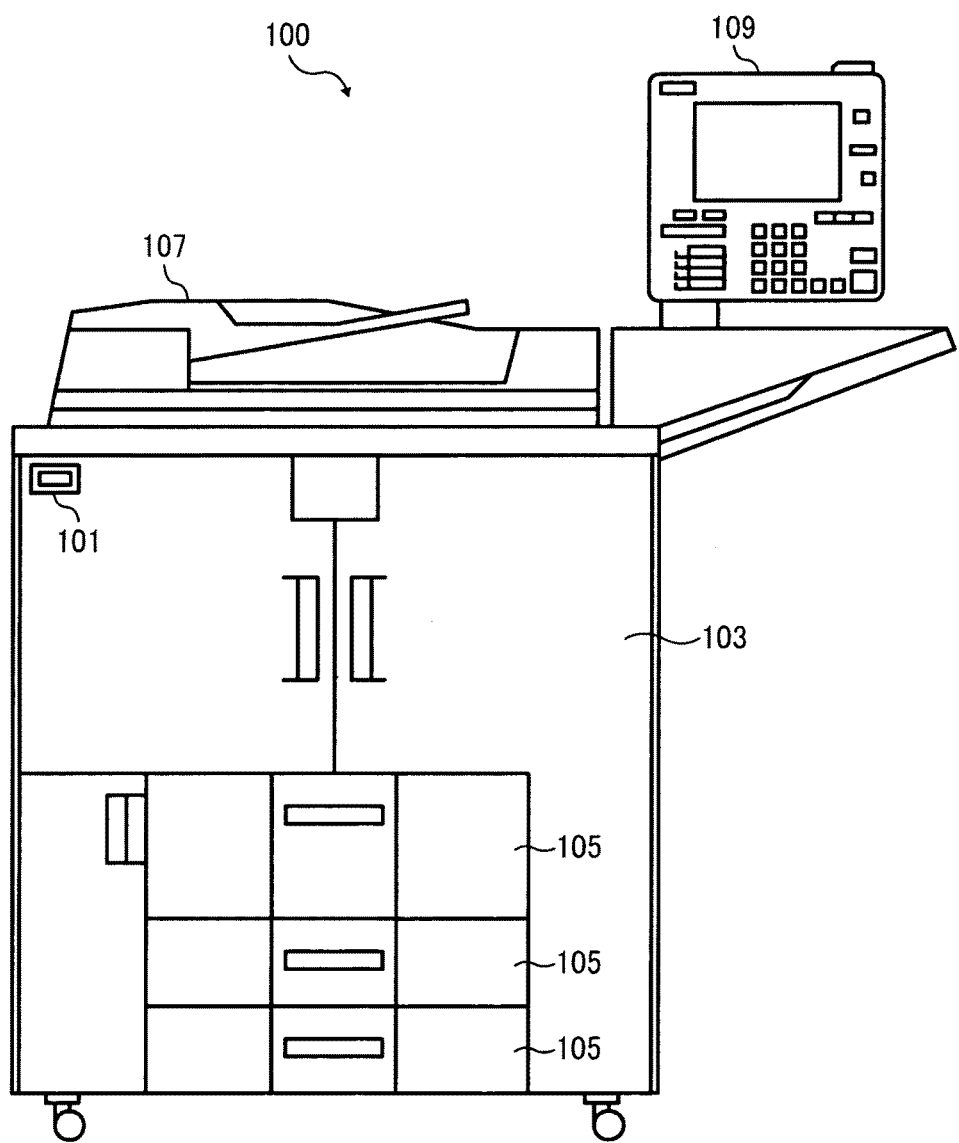
FIG. 1 is a front view illustrating an outer appearance of an image forming apparatus according to an example embodiment of the present invention.

The accompanying drawings are intended to depict example embodiments of the present invention and should not be interpreted to limit the scope thereof. The accompanying drawings are not to be considered as drawn to scale unless explicitly noted.

DETAILED DESCRIPTION OF EXAMPLE EMBODIMENTS

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments shown in the drawings, specific terminology is employed for the sake of clarity. However, the present disclosure is not intended to be limited to the specific terminology so selected and it is to be understood that each specific element includes all technical equivalents that operate in a similar manner.

<Overview of Image Forming Apparatus>

FIG. 1 is a front view illustrating an outer appearance of an image forming apparatus 100 according to an example embodiment of the present invention. The image forming apparatus 100 is a multifunctional apparatus capable of performing a plurality of image forming functions including, for example, copying, scanning, printing, and transmitting data such as facsimile data or image data. Referring to FIG. 1, the image forming apparatus 100 includes a main power switch 101, a front cover 103, a sheet tray 105, an automatic document feeder (ADF) 107, and an operation unit 109.

The operation unit 109 functions as a user interface that interacts with a user. The operation unit 109 is provided with an input device that allows the user to input an instruction including, for example, a button, key, ten-key, microphone, etc. Using the input device of the operation unit 109, the user inputs an instruction for requesting the image forming apparatus 100 to perform specific operation including setting a number of original sheets to be copied or scanned, setting whether to perform color printing or monochrome printing, setting whether to perform single-sided printing or double-sided printing, changing an operation mode of the image forming apparatus 100, etc. In addition to the input device, the operation unit 109 is provided with an output device that provides information to the user such as a liquid crystal display (LCD) having a backlight. Further, in this example, the LCD may be implemented as a touch panel screen that allows the user to input an instruction.

Any desired number of original sheets may be loaded onto the ADF 107. When a copy/scan start button on the operation unit 109 is pressed, the ADF 107 transfers the original sheets, one by one, to an image reading section of a scanner unit. In this example, the original sheet may have an image on one side of sheet or on both sides of sheet. The image forming apparatus 100 includes the scanner unit provided with a Xenon lamp 146 (FIG. 2) and a scanner motor 145 (FIG. 2) that drives the Xenon lamp 146.

When the main power switch 101 is turned on, a power supply unit (PSU) 123 (FIG. 2) supplies a DC voltage to a controller section and a driver section of the image forming apparatus 100 to activate the image forming apparatus 100. When the main power switch 101 is turned off, power supply to the image forming apparatus 100 is automatically turned off after completing the shut-down process.

The front cover 103 is opened to expose the inside of the image forming apparatus 100 in case any repair or maintenance such as removing of jammed sheet is needed. The sheet tray 105 stores therein a stack of recording sheets. In copying operation, the recording sheet, which is transferred from the sheet tray 105, is printed with an image of the original sheet. The printed recording sheet is transferred and discharged to the outside of the image forming apparatus 100. This operation of transferring and discharging is performed by one or more motors of the image forming apparatus 100. As illustrated in FIG. 1, the sheet tray 105 includes a plurality of trays each storing therein a stack of recording sheets.

Figure 2:
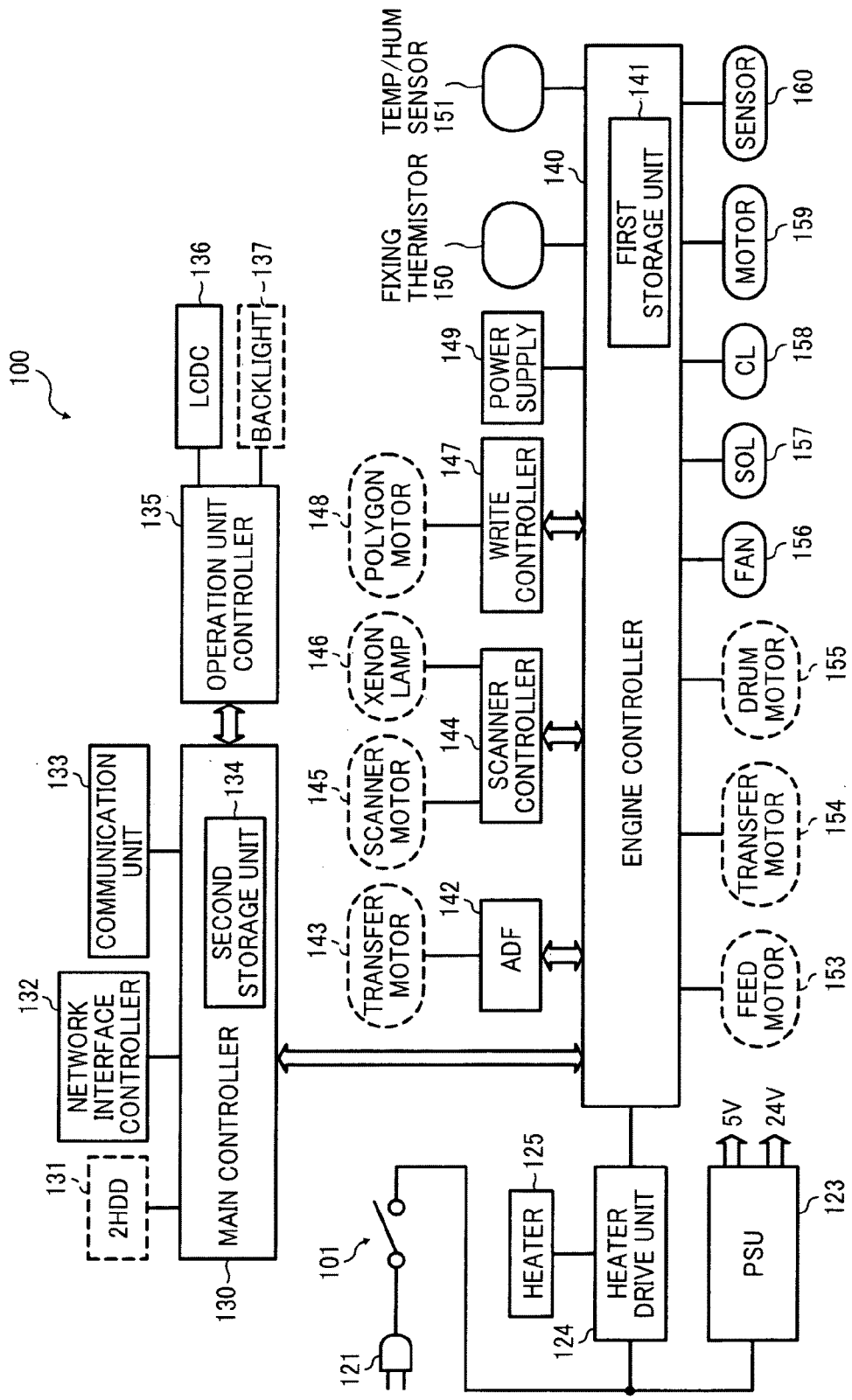
FIG. 2 is a schematic block diagram illustrating an electric system of the image forming apparatus of FIG. 1.

FIG. 2 is a schematic block diagram illustrating an electrical system of the image forming apparatus 100 of FIG. 1. The image forming apparatus 100 includes the main power switch 101, a power supply code 121, the PSU 123, a heater drive unit 124, a heater 125, a main controller 130 provided with a second storage unit 134, 2 hard disk drives (2HDD) 131, a network interface controller 132, a communication unit 133, an operation unit controller 135, a LCD controller (LCDC) 136, the backlight 137, an engine controller 140 having a first storage unit 141, the ADF 142, a scanner controller 144, a write controller 147, a transfer motor 143, the scanner motor 145, the Xenon lamp 146, a polygon motor 148, a power supply 149, a fixing thermistor 150, a temperature/humidity (temp/hum) sensor 151, a feed motor 153, a transfer motor 154, a drum motor 155, a fan 156, a solenoid (SOL) 157, a clutch (CL) 158, a motor 159, and a sensor 160.

When the main power switch 101, which is connected to the power supply code 121, is turned on, electric power is supplied to the heater drive unit 124 and the PSU 123. The DC voltage is supplied by the PSU 123 to the controller section such as the main controller 130 and the engine controller 140, and the driver section such as various parts that are managed by the engine controller 140.

The operation unit 109 (FIG. 1) sends a user instruction input by the user to the main controller 130 via the operation unit controller 135. In this example, the operation unit controller 135 controls the backlight 137 and the LCDC 136. The main controller 130 instructs the engine controller 140 to perform image forming operation according to the user instruction including, for example, scanning operation, copying operation, etc.

Alternatively, the main controller 130 may receive a user instruction for performing image forming operation from the user through a network. In such case, in addition to controlling the operation unit 109 and the engine controller 140, the main controller 130 controls the network interface controller 132. The network interface controller 132 allows the image forming apparatus 100 to connect to a local area network (LAN). The communication unit 133 allows the image forming apparatus 100 to connect to a public switched telephone network (PSTN).

Under control of the main controller 130, the engine controller 140 controls the transfer motor 143 through the ADF 142, the scanner motor 145 and the Xenon lamp 146 through the scanner controller 144, and the polygon motor 148 through the write controller 147. The engine controller 140 further controls the heater drive unit 124 that drives the heater 125, the fixing thermistor 150, the temp/hum sensor 151, the feed motor 153, the transfer motor 154, the drum motor 155, the fan 156, the SOL 157, the CL 158, the motor 159, and the sensor 160. In this example, the engine controller 140 is provided with the first storage unit 141, which stores therein data and programs that may be used by the engine controller 140 to control operation of the above-described parts to perform operation instructed by the user instruction.

The main controller 130 controls various parts of the image forming apparatus 100 to make sure that parts normally operate. The main controller 130 stores, in the second storage unit 134, various data and programs that are used to control operation of image forming using selected parts of the image forming apparatus 100 or operation of managing parts of the image forming apparatus 100. More specifically, the main controller 130 performs various functions of controlling image forming or managing parts of the image forming apparatus according to the program or data stored in the storage unit 134. In one example, the main controller 130 provides a function of managing power consumption of at least a portion of the image forming apparatus 100. This function of managing power consumption of at least a portion of the image forming apparatus 100, which may be referred to as the "power consumption managing function", is now described.

[Accumulated Operation Amount Information]

In the driver section to which power supply is supplied from the PSU 123, there are one or more parts that consume more electric power to perform a specific operation as their age and use increase over time. In other words, total power consumption per work increases over time due to degradation in characteristics of the parts. This causes the image forming apparatus 100 to increase overall power consumption to a certain level exceeding a reference power consumption level. In this example, for each part of the image forming apparatus 100, an upper limit value of electric power consumption is previously set. The main controller 130 manages each part of the image forming apparatus 100 such that power consumption of each part does not exceed this previously set upper limit value of power consumption. More specifically, when the main controller 130 detects that a specific part exceeds its upper limit value of power consumption, the main controller 130 determines that the specific part is degraded and requests the user to replace the specific part with a new part. By replacement, power consumption of the specific part is maintained to be under the upper limit value of power consumption.

In order to manage power consumption of each part of the image forming apparatus 100, information regarding the degree of degradation needs to be obtained for each part of the image forming apparatus 100. Such information regarding the degree of degradation of each part is obtainable by monitoring an operation state of each part from the time when each part is installed or replaced. For example, accumulated usage or operation time during which the part is used or operated may be counted from the time when the part is installed or replaced. In another example, an accumulated number of times the part is used or operated may be counted from the time when the part is installed or replaced. For the descriptive purpose, the accumulated usage time and/or accumulated number of times of usage may be collectively referred to as accumulated usage information, or simply usage information. The accumulated operation time and/or accumulated number of times of operation may be collectively referred to as accumulated operation amount information, or simply operation amount information. Further, the usage information and the operation amount information may be used exchangeably as they both reflect the lifetime of the subjected part, which indicates the degree of degradation in characteristics of the subjected part.

Since obtaining operation amount information for each part of the image forming apparatus 100 is not practical, in this example, the parts that are indicated by dashed line in FIG. 2 are selected for monitoring. These parts are selected as they tend to consume relatively a large amount of electric power. Further, these parts have a higher rate of increase in electric power consumption over time. The selected parts include 2HDD 131, backlight 137, transfer motor 143, scanner motor 145, Xenon lamp 146, polygon motor 148, feed motor 153, transfer motor 154, and drum motor 155. In this example, the parts selected for monitoring are selected at the time of shipping such that information regarding the selected parts is stored in a memory of the image forming apparatus 100.

In addition to these selected parts, any desired part may be additionally monitored for electric power consumption. Alternatively, any one of these selected parts may be determined not to be subjected for monitoring, for example, when the user determines that maintenance, such as replacement, of any one of the parts would be difficult. For the descriptive purpose, it is assumed that the degree of increase in power consumption over time can be ignored for those parts other than the selected parts. More specifically, the parts other than the selected parts are assumed to consume electric power at a constant rate, while the selected parts are assumed to consume more electric power as their age or usage increase.

The selected parts for monitoring may be classified into a motor part, lamp part, and HDD part.

The motor part includes the feed motor 153, the transfer motor 143, the transfer motor 154, the drum motor 155, the scanner motor 145, and the polygon motor 148. In case when the motor part is implemented by a brushless motor, the rotational shaft of the motor may be worn out over time, thus requiring more electric power.

The lamp part includes the Xenon lamp 146 and the backlight 137. In order to cause the lamp part to keep emitting a predetermined level of light irrespective of decreased capability of the lamp part, for example, due to the degraded lighting tube surface, the amount of power consumption needs to be increased.

The HDD part includes the 2HDD 131. The 2HDD 131 are each provided with a motor drive part, which may require more electric power over time as in the case of motor part.

While the part subjected for monitoring may be replaced with a new part of the same model when electric power consumption of the part exceeds the upper limit value, the part subjected for monitoring may be replaced with a part of a newer model or any part capable of providing the same function in a more energy efficient manner. By replacing with a part of a newer model that is more energy efficient, for example, electric power consumption may be further reduced. For example, the HDD may be replaced by a solid state drive (SSD). In another example, the Xenon lamp may be replaced with a Xenon lamp of a new model having higher lighting efficiency.

[Setting of Upper Limit Value]

The upper limit value of power consumption for each selected part, or the upper limit value of overall power consumption for the image forming apparatus 100, is stored in the second storage unit 134 of the main controller 130, for example, before the image forming apparatus 100 is shipped. In this example, the upper limit value of power consumption for the subjected part is determined to be about 1.2 times greater than the initial value of average power consumption of the subjected part measured when it is new. When the current value of power consumption of the subjected part exceeds the previously set upper limit value, the main controller 130 sends a message requesting replacement of the part through a network, or display such message through the operation unit 109. Additionally or alternatively, information indicating that the current value of power consumption of the subjected part exceeds the previously set upper limit value is stored in a memory such as the HDD 131.

In another example, the upper limit value of power consumption may be arbitrarily set by the user. In one example, the upper limit value of power consumption may be set individually for each part based on information regarding estimated lifetime of each part. Alternatively, the user may determine a target value of power consumption of the image forming apparatus 100, which is an upper limit value that is allowed for the image forming apparatus 100 to consume for a predetermined time period such as for one week. Based on this target value, the main controller 130 of the image forming apparatus 100 may automatically calculate the upper limit value for each part subjected for monitoring. For example, electric power consumption may be expressed in Typical Electricity Consumption (TEC) defined by the International Energy Star Program. When the user sets the upper limit value by inputting a predetermined value of TEC, the image forming apparatus 100 automatically calculates the upper limit value for each operation mode such that power consumption of the image forming apparatus 100 for each operation mode is kept within the predetermined value of TEC, and stores the calculated upper limit value for each operation mode in any desired memory. For example, as illustrated in FIG. 13, the second storage unit 134 may store therein power consumption information for each of operation modes of the image forming apparatus 100 such as the upper limit value of power consumption.

The second storage unit 134 further stores the initial value of power consumption that is obtained for each subjected part when the subjected part is new, a table or a formula that indicates relationship between lifetime and power consumption for each subjected part, and lifetime count information indicating how the lifetime is counted. For example, the lifetime count information indicates whether to count the remaining lifetime by an accumulated time period during which the subjected part is supplied with electric power, a number of printing operations that is performed by the image forming apparatus 100, or a number of scanning operations that is performed by the image forming apparatus 100. Further, in this specification, since the remaining lifetime is expressed in terms of a number of times the subjected part is used or a time during which the subjected time is used, higher values of lifetime indicate that the subjected part has less lifetime that is remained, while lower values of lifetime indicate that the subjected part has greater lifetime that is remained.

In order to manage power consumption of each part according to the upper limit value previously determined for each part, a current value of power consumption for each part needs to be obtained. In this example, the current value of power consumption for each part is estimated from the accumulated number of times of operations or accumulated time during which each part is operated. More specifically, the relationship between the accumulated number of times or time of operations ("the usage information") and the value of power consumption is previously obtained based on experimental data. Using the relationship between the accumulated number of times or time of operations and the value of power consumption, the current value of power consumption for each part that corresponds to the current value of accumulated number of times or time of operations for each part is obtained.

Figure 3:
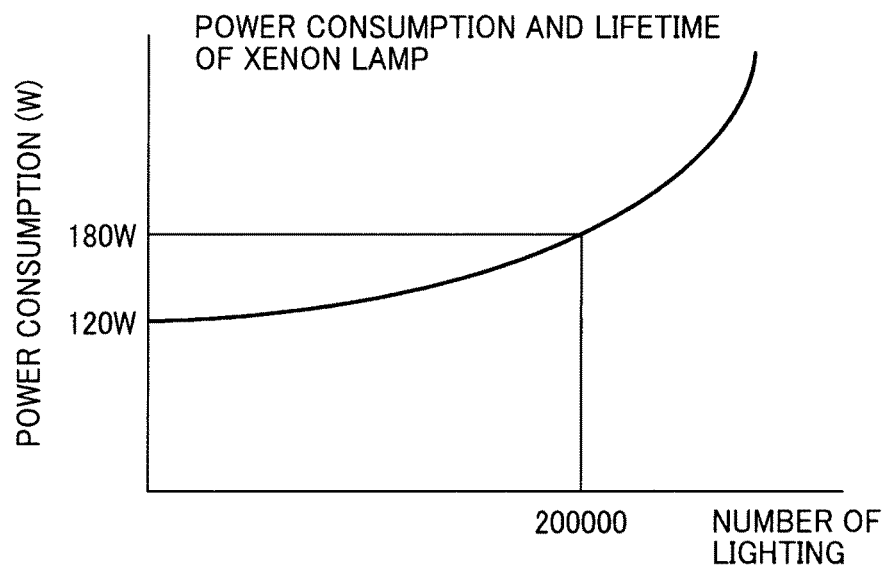
FIG. 3 is a graph showing the correspondence between electric power consumption of a Xenon lamp provided in the image forming apparatus of FIG. 1 and an accumulated number of times the Xenon lamp is lighted.

FIG. 3 illustrates the relationship between electric power consumption and a number of times the Xenon lamp is lighted, which is obtained for a Xenon lamp that may be installed I the image forming apparatus 100 as the Xenon lamp 146. The vertical axis of the graph of FIG. 3 indicates power consumption of the Xenon lamp, and the horizontal axis of the graph of FIG. 3 indicates a number of lighting the Xenon lamp that reflects the remaining lifetime of the Xenon lamp. The curve of FIG. 3, which is the relationship between the power consumption and the number of lighting, may be referred to as a lifetime curve. As illustrated in FIG. 3, power consumption of 180 W obtained after the Xenon lamp is lighted for a total of 200,000 times is 50 percent greater than the initial power consumption of 120 W obtained when the Xenon lamp is installed.

Figure 4:
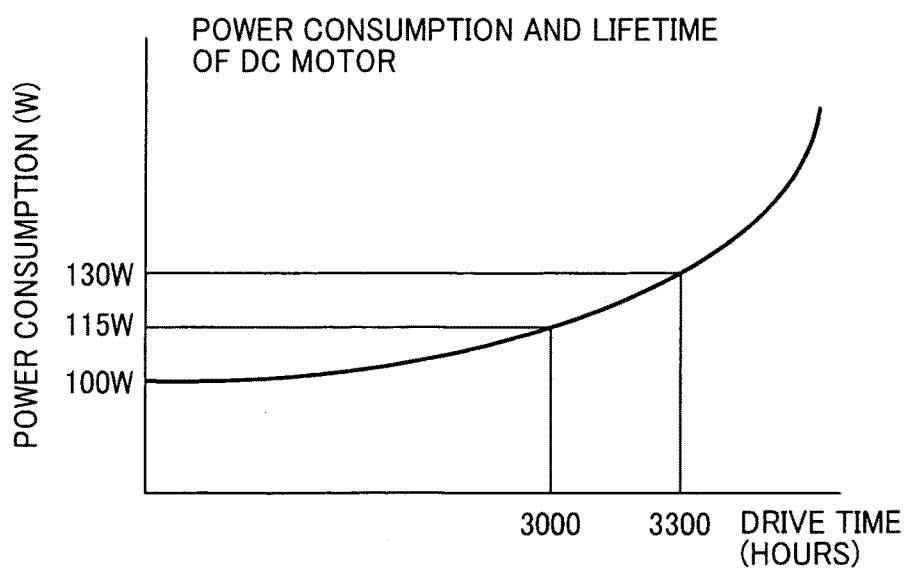
FIG. 4 is a graph showing the correspondence between electric power consumption of a DC motor provided in the image forming apparatus of FIG. 1 and an accumulated time during which the DC motor is driven.

FIG. 4 illustrates the relationship between electric power consumption and a drive time during which a DC motor is operated, obtained for a DC motor that may be installed in the image forming apparatus 100 as the motor part. The vertical axis of the graph of FIG. 4 indicates power consumption of the DC motor, and the horizontal axis of the graph of FIG. 4 indicates the drive time during which the DC motor is driven. The curve of FIG. 4, which is the relationship between the power consumption and the drive time, may be referred to as a lifetime curve. As illustrated in FIG. 4, electric power consumption obtained when the DC motor is driven for a total of 3000 hours is 15 percent greater than the initial power consumption of 100 W obtained when the DC motor is installed. The electric power consumption obtained when the DC motor is driven for a total of 3300 hours is 30 percent greater than the initial power consumption of 100 W obtained when the DC motor is installed.

[Operation Mode of Image Forming Apparatus]

The image forming apparatus 100 of FIG. 1 operates under the modes including a warm-up mode, a copy mode, a print mode, a scan mode, a ready mode, an energy save mode, and a sleep mode.

The warm-up mode corresponds to a state of the image forming apparatus 100 when the image forming apparatus 100 is performing preparation operation before it moves onto the ready mode after turning on of the main power switch or receiving a user instruction to release the sleep state.

The copy mode corresponds to a state of the image forming apparatus 100 when the image forming apparatus 100 is performing copying operation including scanning operation and printing operation. The copy mode may be further classified into a plurality of modes depending on a specific type of copying.

The print mode corresponds to a state of the image forming apparatus 100 when the image forming apparatus 100 is performing printing operation. The print mode may be further classified into a plurality of modes depending on a specific type of printing.

The scan mode corresponds to a state of the image forming apparatus 100 when the image forming apparatus 100 is performing scanning operation. The scan operation may be further classified into a plurality of modes depending on a specific type of scanning.

The ready mode corresponds to a state of the image forming apparatus 100 when the image forming apparatus 100 is ready for performing any one of scanning operation and printing operation.

The energy save mode corresponds to a state of the image forming apparatus 100 in which power consumption is reduced with respect to power consumption required when the image forming apparatus 100 operates under the ready mode. In order to reduce power consumption, the temperature of the heater 125 is made lower, and operation of some parts of the image forming apparatus 100 such as the backlight 137 and a portion of the motors is stopped. The time required for the image forming apparatus 100 to change from the energy save mode to the ready mode is between 10 seconds and 40 seconds.

The sleep mode corresponds to a state of the image forming apparatus 100 in which power consumption is greatly reduced. In the sleep mode, electric power is supplied only to the PSU 123 and a portion of the main controller 130 such that the other portions of the image forming apparatus 100 stops operating as no electric power is supplied.

[Obtaining Accumulated Operation Amount Information of Each Part]

In order to obtain accumulated operation amount information indicating an accumulated number of times the subjected part is operated or accumulated time during which the subjected part is operated, in one example, information regarding how much degree the subjected part is used under each operation mode is previously obtained to generate information indicating an accumulated number of times or accumulated time the subjected part has been used. In another example, information regarding how much degree the subjected part is used to complete each image forming job, such as printing job, is previously obtained to generate information indicating an accumulated number of times or accumulated time the subjected part has been used.

FIG. 5 is a table storing information indicating how much degree the Xenon lamp 146 is used under each operation mode. In scan mode or copy mode, the Xenon lamp 146 is lighted one time per scanning operation or copying operation. In warm-up mode, the Xenon lamp 146 is lighted one time at the time of execution. In print mode, ready mode, or energy-save mode, the Xenon lamp 146 is not lighted.

Using the information stored in the table of FIG. 5, and log information indicating a specific operation that has been performed by the image forming apparatus 100, an accumulated number of times the Xenon lamp 146 is lighted is obtained. The main controller 130 monitors operation of the image forming apparatus 100 to obtain usage information of the Xenon lamp 146, and stores the obtained usage information in the memory.

Information indicating the degree of usage under each operation mode may be prepared in a substantially similar manner for the motor part, the backlight part, and the HDD part. Information regarding a number of times or time in which each part is used under each mode may be stored, for example, in the form of table, in the HDD 131 or the second storage unit 134.

Alternatively, an accumulated number of times or time of usage may be estimated in other various ways. For example, in case of transfer motor 154 for transferring the recording sheet, usage time can be estimated based on a time during which the drum motor 155 is rotated, which is obtainable using a timer provided in any one of the main controller 130 and the engine controller 140

[Obtaining Power Consumption of Each Part]

The current value of power consumption, which reflects the amount of carbon dioxide emission, for each part is calculated based on information indicating the relationship between usage information and power consumption such as the one shown in FIG. 3, or 6. Alternatively, the current value of power consumption may be obtained using a look-up table storing the correspondence usage information and power consumption. For example, information indicated by the graph of FIG. 4 may be expressed in the form of table of FIG. 6. Using this usage-power consumption table of FIG. 6, power consumption, which corresponds to the usage information such as a time of usage expressed in hours, is obtained as the current value of power consumption for the DC motor. In case when the time of usage that is obtained is not stored in the usage-power consumption table of FIG. 6, the current value is estimated based on the value that corresponds to the time of usage that is close in value to the obtained time of usage. In one example, assuming that the usage time of 200 hours is obtained for the DC motor, the current value of power consumption may be estimated as 102 W that corresponds to the usage time of 300 hours. In another example, the current value of power consumption may be calculated using approximation. Assuming that the usage time linearly increases at least between usage time of 0 to 300 hours, power consumption increase rate per hour is obtained as follows.

$$(102\ W-100\ W)/(300\ hours-0\ hours)=0.067\ (W/h)$$

The current value of power consumption can be obtained by multiplying the obtained usage time with 0.067. Since the usage-power consumption relationship may be expressed in various forms including the usage-power consumption table or the conversion formula, the usage-power consumption relationship may be stored in any desired form.

Figure 7:
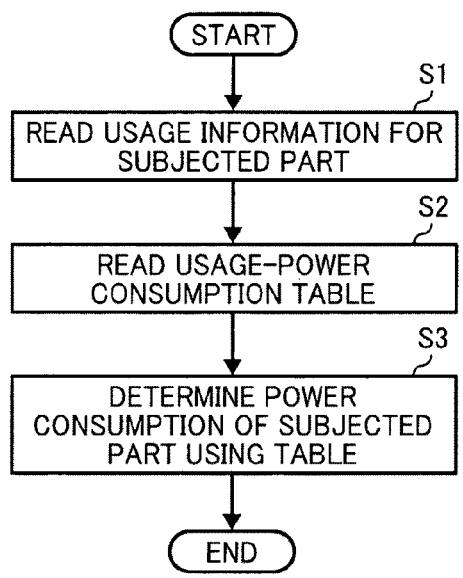
FIG. 7 is a flowchart illustrating operation of obtaining part-specific power consumption information for each part of the image forming apparatus of FIG. 1 that is selected for monitoring.

Referring to FIG. 7, example operation of obtaining power consumption for each part of the image forming apparatus 100 subjected for monitoring, performed by the image forming apparatus 100, is explained.

At S1, the main controller 130 reads usage information indicating a number of times the subjected part is used or an overall time during which the subjected part is used from the second storage unit 134.

At S2, the main controller 130 reads the usage-power consumption table indicating the relationship between usage information and power consumption for the subjected part from the second storage unit 134.

At S3, the main controller 130 refers to the usage-power consumption table obtained at S2 to obtain power consumption that corresponds to the usage information that is obtained at S1. The obtained power consumption is the current value of the power consumption for the subjected part.

The above-described steps of S1 to S3 are repeated for each part of the subjected parts for monitoring. Further, the above-described operation of obtaining the current value of power consumption may be performed in various other ways. For example, in alternative to referring to the usage-power consumption table, the main controller 130 may refer to the conversion formula that converts the value of usage information to the value of power consumption to obtain the current value of power consumption.

[Managing Power Consumption of the Image Forming Apparatus by Part]

Figure 8:
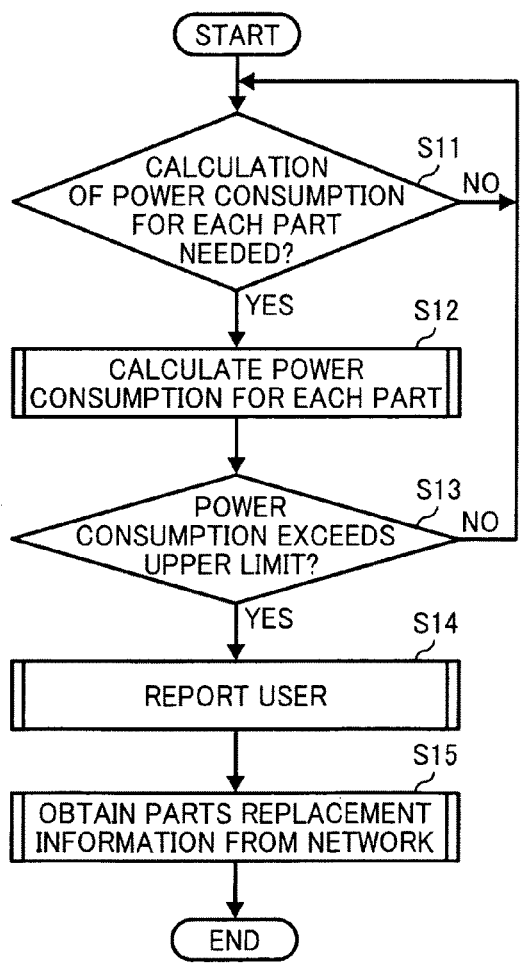
FIG. 8 is a flowchart illustrating operation of managing power consumption of the image forming apparatus of FIG. 1, using part-specific power consumption information, according to an example embodiment of the present invention.

Referring to FIG. 8, example operation of managing power consumption of the image forming apparatus 100 by part is explained.

At S11, the main controller 130 determines whether the current value of power consumption for the subjected part needs to be obtained. For example, at 511, the main controller 130 may be programmed to determine that the current value needs to be obtained at a predetermined time. In such case, the main controller 130 determines whether a current value of time reaches a threshold value previously set. For example, the time at which the current value of power consumption needs to be obtained may be set by default or according to the user preference, such as once per day, once per ten days, etc. In another example, the main controller 130 may be programmed such that it automatically executes the operation of FIG. 8 every time after the image forming apparatus 100 is turned on. When it is determined that the current value of power consumption is needed ("YES" at S11), the operation proceeds to S12. When it is determined that the current value of power consumption is not needed ("NO" at S11), the operation repeats S11.

At S12, the main controller 130 calculates the current value of power consumption for the subjected part in a substantially similar manner as described above referring to FIG. 7.

At S13, the main controller 130 determines whether the current value of power consumption for the subjected part, which is obtained at S12, exceeds the upper limit of power consumption for the subjected part that is previously determined. When it is determined that the current value of power consumption exceeds the upper limit value of power consumption ("YES" at S13), the operation proceeds to S14. When it is determined that the current value of power consumption does not exceed the upper limit value of power consumption ("NO" at S13), the operation returns to S11.

At S14, the main controller 130 causes the operation unit 109 to notify the user that the current value of power consumption for the subjected part exceeds the upper limit value. For example, the operation unit 109 displays a screen 201 of FIG. 9 on the LCD of the operation unit 109. The screen 201 includes a message indicating that the current value of power consumption for the subjected part exceeds the upper limit value, a message requesting the user to replace the subjected part with a new part, a "DISPLAY DETAILS" button 202, and a "CANCEL" button 203. When the "DISPLAY DETAILS" button 202 is pressed, the operation unit 109 displays a replaceable parts information screen 300 of FIG. 10 that includes detailed information regarding the subjected part that exceeds the upper limit of power consumption. When the "CANCEL" button 203 is pressed, the screen 201 is closed. As long as at least one of the parts subjected for monitoring exceeds the upper limit value of power consumption, the operation unit 109 keeps displaying the screen 201 even after the power of the image forming apparatus 109 is turned off.

For example, after the main power switch 101 is turned on, the main controller 130 refers to the storage unit 134 to determine whether there is at least one subjected part that has exceeded the upper limit value of power consumption. When it is determined that there is at least one subjected part that exceeds the upper limit value of power consumption, the operation unit 109 is instructed to display the screen 201 of FIG. 9. Alternatively, such information regarding the subjected part that exceeds the upper limit of power consumption may be displayed at any desired time according to the user need.

Figure 10:
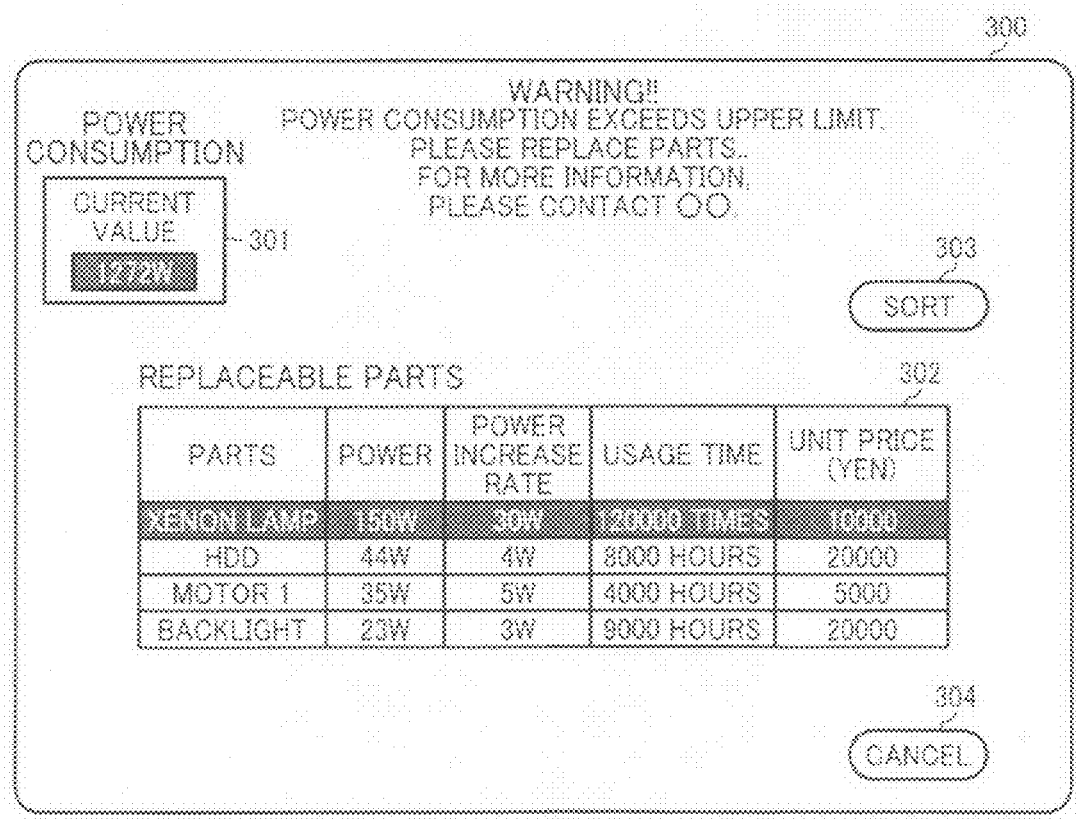
FIG. 10 is an example replaceable parts information screen displayed by the image forming apparatus of FIG. 1.

The replaceable parts information screen 300 of FIG. 10 includes a power consumption display section 301, a replaceable parts list 302, a "SORT" button 303, and a "CANCEL" button 304. The power consumption display section 301 displays the current value of power consumption of the image forming apparatus 100 that includes the subjected part that exceeds the upper limit value of power consumption.

The replaceable parts list 302 lists various information regarding the subjected part that exceeds the upper limit including, for example, the parts name, the current value of power consumption, the increased amount of power consumption, the usage time, and the unit price. In addition to information regarding the subjected part that exceeds the upper limit, the replaceable parts list 302 may display power consumption information regarding the subjected part that is most likely to exceed the upper limit in the near future.

By pressing the "SORT" button 303, the user is able to sort information contained in the replaceable parts list 302, for example, in an order determined based on the current value of power consumption, the value of increased power consumption, the unit price, parts name, etc.

When one of the replaceable parts listed in the replaceable parts list 302 is selected, for example, through clicking any portion of the row containing information regarding the replaceable part for selection, the operation unit 109 displays a parts replacement information screen for the selected replaceable part.

More specifically, referring back to FIG. 8, when one of the replaceable parts listed in the replaceable parts list 302 is selected, the operation proceeds to S15 to obtain information regarding the parts replacement information through a network. Based on the obtained parts replacement information, the image forming apparatus 100 displays a parts replacement information screen.

Figure 11:
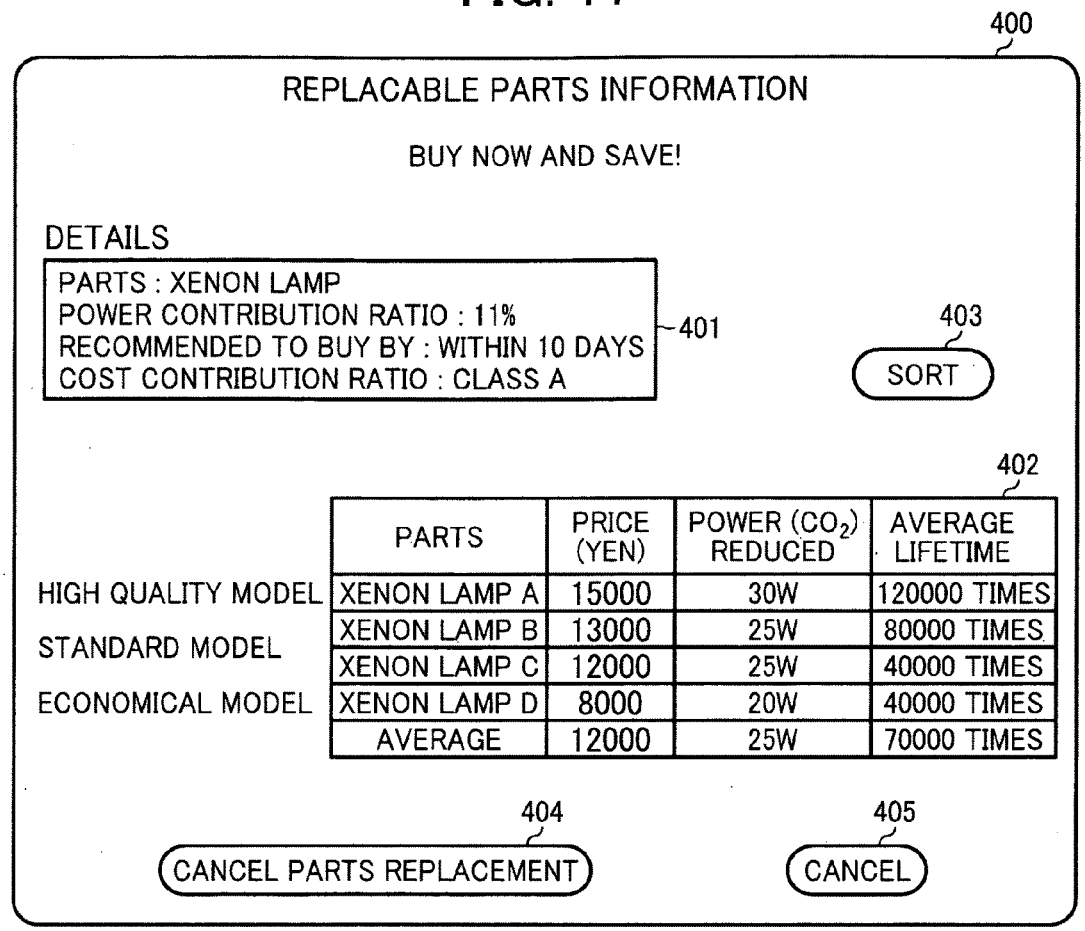
FIG. 11 is an example parts replacement information screen displayed by the image forming apparatus of FIG. 1.

FIG. 11 is an example parts replacement information screen 400, which is displayed when the Xenon lamp is selected from the replaceable parts list 302 of the replaceable parts information screen 300. The parts replacement information screen 400 includes a display section 401 in which information regarding the subjected part for replacement is displayed, an available parts list 402, a "SORT" button 403, a "CANCEL PARTS REPLACEMENT" button 404, and a "CANCEL" button 405.

The information regarding the subjected part for replacement displayed in the display section 401 includes, for example, the parts name, the electric power contribution ratio, the recommended time for buying a new part to be replaced with the subjected part, and the cost contribution ratio. The available parts list 402 lists information regarding the parts for replacement, which are available for user. When the "SORT" button 403 is pressed, information included in the available parts list 402 is sorted, for example, in an order determined based on the parts name, the price, the power consumption reduction, or the average lifetime. When the user selects one of the available parts listed in the available parts list 402, the main controller 130 sends information regarding the selected available part to a service engineer through a network. The service engineer is then able to send or bring the selected part to the user for replacement.

Figure 12:
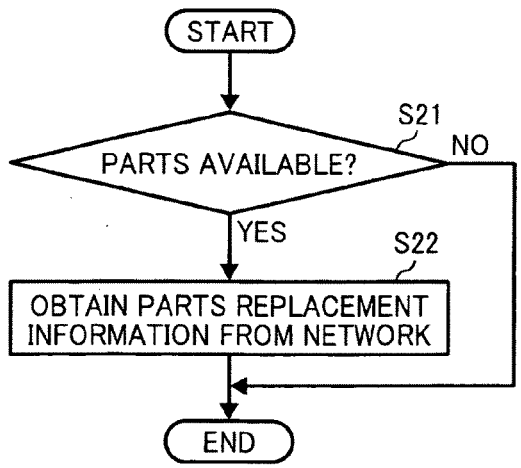
FIG. 12 is a flowchart illustrating operation of obtaining parts replacement information.

As described above, the screen 400 of FIG. 11 is displayed upon execution of S15 of FIG. 8. More specifically, referring to FIG. 12, at S21, the main controller 130 determines whether there is any part available for replacement with the subject part that exceeds the upper limit. When it is determined that there is at least one part available for replacement ("YES" at S21), the operation proceeds to S22 to obtain available parts information regarding the parts available for replacement. When it is determined that there is no parts available for replacement ("NO" at S21), the operation ends. When no parts are available for replacement, the image forming apparatus 100 may generate the parts replacement information screen 400 having no information regarding available parts, preferably, with a message indicating that there is no parts available for replacement. Further, in this example, the parts available for replacement may include used parts, in addition to new parts.

When the subjected part is replaced with a new or used part, the image forming apparatus 100 may obtain and store in the memory various information regarding the replacement activity of the user, a number of times the part is used at the time of replacement, a time during which the part has been used at the time of replacement, etc. Such information regarding parts replacement may be sent through the network to be stored in a server provided on the network. Alternatively, a location for storing information regarding parts replacement may be determined to be one place, such as at the HDD 131 or the second storage unit 134. Alternatively, locations for storing information regarding parts replacement may be distributed over the network.

With the power consumption managing function of the image forming apparatus 100, the image forming apparatus 100 is able to provide more detailed information regarding power consumption of the image forming apparatus by part including, for example, which part of the image forming apparatus has the current value of power consumption that exceeds the upper limit value. More specifically, the image forming apparatus 1 notifies the user regarding one or more parts that contributes to the increase in power consumption of the image forming apparatus 100. Since the current value of power consumption of the subjected part is obtained based on the accumulated operation amount information of the subjected part based on the operation state of the subjected part such as a number of times the subjected part is used or a time during which the subjected part is used, the current value of power consumption is easily obtained, without requiring an additional hardware structure, with improved accuracy. Further, with this accumulated operation amount information obtained for a specific part, the current value of power consumption is calculated such that the image forming apparatus 100 is able to identify which part of the image forming apparatus 100 contributes to the increase in power consumption of the image forming apparatus 100 over time.

Further, various information regarding the subjected part may be uploaded to a server at the manufacturer of the image forming apparatus 100. Such information regarding the usage or operation of the subjected part at the user site may be analyzed and used for a future development activity or a future marketing activity.

Further, in addition to notifying the user that there is at least one part that exceeds the upper limit value of power consumption, the image forming apparatus 100 is able to provide more detailed information regarding the part exceeding the upper limit, or any available part for replacement with such part.

In alternative to the above-described example of managing power consumption by part, power consumption of the image forming apparatus 100 may be managed by operation mode of the image forming apparatus 100.

[Obtaining Power Consumption by Operation Mode]

In order to manage power consumption of the image forming apparatus 100 by its operation mode according to the upper limit value previously determined for each operation mode, a current value of power consumption for each operation mode needs to be obtained. In this example, the current value of power consumption for each part under each operation mode is estimated from the operation state of the subjected part, such as the accumulated number of times of operation or the accumulated time in which the subjected part is operated. More specifically, the relationship between the accumulated number of times or the accumulated time ("usage information"), and the value of power consumption is previously obtained based on experimental data. Using the relationship between the accumulated number of times or accumulated time and the value of power consumption, the current value of power consumption for each part that corresponds to the accumulated number of times or accumulated time for each part is obtained, under each of operation modes.

In one example, for each one of the operation modes, one or more parts subjected for monitoring are identified. In this example, the parts that are indicated by the dashed line of FIG. 2 are selected for monitoring. Based on the current value of power consumption obtained for each subjected part for a specific operation mode, the current value of power consumption of the image forming apparatus 100 for the specific operation mode is obtained.

As described above, the main controller 130 manages power consumption of the image forming apparatus 100 such that the current value of power consumption is within the upper limit value previously set. The increase in power consumption of the image forming apparatus 100 over time can be approximated by the increase in power consumption of the subjected part for monitoring. Thus, the current value of power consumption of the image forming apparatus 100 is obtained by adding the increased value of power consumption of the subjected part to the initial value of power consumption of the image forming apparatus 100. In this example, the second storage unit 134 stores information regarding the initial value of power consumption of the image forming apparatus 100 for each operation mode, and the upper limit value of power consumption for each operation mode. Unless the parts of the image forming apparatus 100 are managed, the value of power consumption would exceed the upper limit as the parts are degraded. When the main controller 130 determines that the current value of power consumption exceeds the upper limit value, the main controller 130 sends a message requesting replacement of the part through a network, or display such message through the operation unit 109. Additionally or alternatively, information indicating that the current value of power consumption for a specific operation mode exceeds the previously set upper limit value is stored in a memory such as the HDD 131.

The upper limit value of power consumption may be previously set, for example, before the image forming apparatus 100 is shipped. Alternatively, the upper limit value of power consumption may be arbitrarily set by the user. For example, the user may determine a target value of power consumption of the image forming apparatus 100, which is an upper limit value that is allowed for the image forming apparatus 100 to consume for a predetermined time period such as for one week. In such case, the image forming apparatus 100 may automatically calculate an upper limit value for each of operation modes based on the target value of power consumption determined by the user.

For example, assuming that the user inputs a predetermined value of TEC according to the International Energy Star Program, the image forming apparatus 100 automatically calculates an upper limit value of each of operation modes of the image forming apparatus 100 such that the TEC of the image forming apparatus 100 is kept below the predetermined value.

Further, the image forming apparatus 100 stores information regarding the parts subjected for monitoring in any desired memory such as the storage unit 134 or the storage unit 141 including, for example, the initial value of power consumption for each subjected part, the usage information indicating the lifetime of each subjected part, information indicating the relationship between power consumption and usage information such as the usage-power consumption table or conversion formula, information indicating a method of counting or measuring usage information, etc.

FIG. 13 illustrates information regarding power consumption of the image forming apparatus 100 obtained for each operation mode. More specifically, for each of the operation modes, the initial value and the upper limit value of power consumption of the image forming apparatus 100 are stored. In addition to the initial value and the upper limit value, the current value of power consumption is stored at the time when it is obtained.

FIG. 14 is a table storing power consumption information for each part subjected for monitoring, which is prepared for the copy mode. Referring to FIG. 14, for each one of the subjected parts, the table stores the initial value of power consumption, the cost of the subjected part, a method of measuring the lifetime, information regarding the usage-power consumption table or conversion formula ("POWER-LIFE TABE OR FORMULA"), the current lifetime, and the current value of power consumption for the subjected part. As described above, the lifetime of the subjected part can be approximated by the accumulated operation amount information that is obtained based on the operate state of the subjected part.

The current value of power consumption as well as the current lifetime for the subjected part is updated based on the usage information, or the accumulated operation amount information, of the subjected part. More specifically, the main controller 130 or the engine controller 140 monitors the operate state of the subjected part, such as a number of times or time in which the subjected part is used, using the specified method of measuring the lifetime. Based on the obtained number of times or time in which the subjected part is used, the power consumption is estimated using information indicating the correspondence between the usage information and the power consumption.

For example, in case of the Xenon lamp having the lifetime curve illustrated in FIG. 3, the current value of power consumption that corresponds to the obtained value of usage information may be obtained by multiplying the initial value of power consumption with one of coefficients that is selected based on a number of times the Xenon lamp is lighted. When the number of lighting is equal to or greater than 0 but below 50,000, the current value of power consumption is obtained by multiplying the initial value with 1.1. When the number of lighting is equal to or greater than 50,000 but below 100,000, the current value of power consumption is obtained by multiplying the initial value with 1.2. When the number of lighting is equal to or greater than 100,000 but below 150,000, the current value of power consumption is obtained by multiplying the initial value with 1.3. When the number of lighting is equal to or greater than 150,000 but below 200,000, the current value of power consumption is obtained by multiplying the initial value with 1.4. When the number of lighting is equal to or greater than 200,000 but below 250,000, the current value of power consumption is obtained by multiplying the initial value with 1.5. When the number of lighting is equal to or greater than 250,000 but below 300,000, the current value of power consumption is obtained by multiplying the initial value with 1.7, and so on.

Once the current value of power consumption for each subjected part is obtained, the main controller 130 obtains the current value of power consumption for each operation mode, which is stored in FIG. 13, based on the current values of power consumption for the parts listed in FIG. 14. For example, the initial value of power consumption for the copy mode is 1200 W as illustrated in FIG. 13. Of 1200 W of power consumption, the heater 125 accounts for 700 W of power consumption, and the PSU 123 accounts for 500 W of power consumption. The parts listed in FIG. 14, which all belong to the PSU 123, account for 390 W of power consumption out of 500 W power consumption, as indicated by the total initial value of power consumption of FIG. 14. This indicates that the value of power consumption of the image forming apparatus 100 for the copy mode is obtained by adding the value of power consumption for the subjected part listed in the table of FIG. 14, to the value of 810 W that reflects the value of power consumption for the other parts of the image forming apparatus. Since the total current values of power consumption for the subjected parts listed in the table of FIG. 14 for the copy mode is 462 W, the current value of power consumption of the image forming apparatus 100 for the copy mode is obtained as 1272 W, as illustrated in FIG. 13.

[Energy Conservation]

As described above, the user may set a predetermined value of TEC as the upper limit value of power consumption that the image forming apparatus 100 is allowed to consume for one week. In such case, the image forming apparatus 100 automatically calculates an upper limit value for each of the operation modes of the image forming apparatus 100 based on the predetermined value of TEC, and stores the calculated upper limit value in the memory, for example, in the form of table such as the table of FIG. 13.

For example, the image forming apparatus 100 previously stores a specific TEC value in a memory as a reference value of power consumption. For example, when the TEC value of 14558 Wh is stored, the image forming apparatus 100 automatically calculates the values of power consumption respectively for the operation modes of the image forming apparatus 100. More specifically, 1300 W, 1200 W, 1050 W, 450 W, 250 W, 150 W, and 20 W are respectively obtained for the warm-up mode, copy-mode, print mode, scan mode, ready-mode, energy-save mode, and sleep mode. These values are stored as the initial values of the respective operation modes. Further, these values of initial values may differ, depending on a specific type of the image forming apparatus 100.

More specifically, in this example, the image forming apparatus 100 is provided with a calculation program as well as a correction coefficient, which allows the main controller 130 to estimate the amount of power consumption for each operation mode based on a specific equation. The specific equation defines the value of TEC from the initial values of power consumption for the respective operation modes, a number of recording sheets being copied per minute (CPM), a warm-up time required for the image forming apparatus 100 to change from the warm-up mode to the ready mode, a first copy time required for the recording sheet to be discharged that is counted from pressing of the start button, and a time required for the image forming apparatus 100 to change from the energy-save mode to the ready mode. Using the calculation program and the correction coefficient, the main controller 130 calculates the upper limit value of each operation mode based on the predetermined value of TEC, which is input by the user as the upper limit value of power consumption. For example, assuming that the user inputs the TEC of 15000 Wh, the calculated initial values of the respective operation modes are: 1350 W for the warm-up mode, 1250 W for the copy mode, 1100 W for the print mode, 470 W for the scan mode, 270 W for the ready mode, 170 W for the energy-save mode, and 25 W for the sleep mode.

Figures 15, 16:
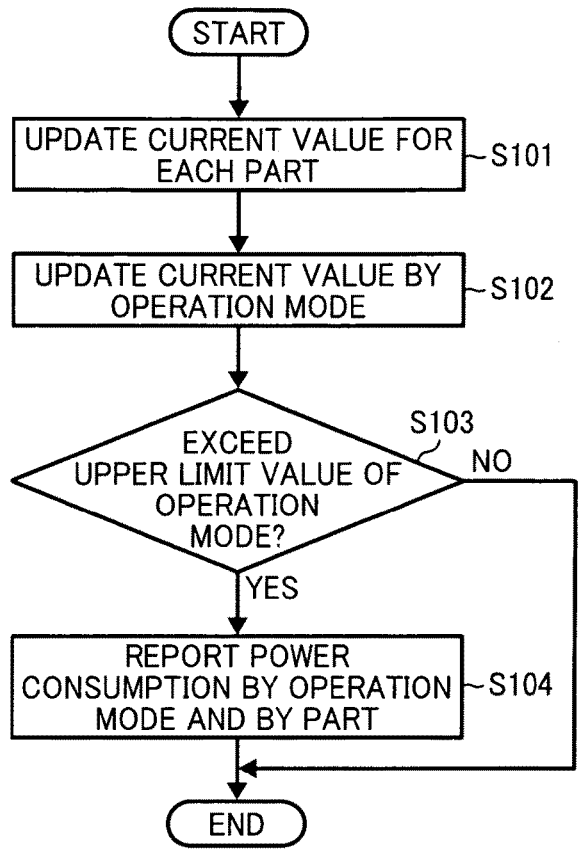
FIG. 15 is a flowchart illustrating operation of managing power consumption of the image forming apparatus of FIG. 1 by operation mode, using part-specific power consumption information, according to an example embodiment of the present invention.
FIG. 16 is a table storing power consumption information of the image forming apparatus of FIG. 1 for the copy mode, obtained after the Xenon lamp is replaced.

Referring now to FIG. 15, operation of managing power consumption by operation mode, performed by the image forming apparatus 100, is explained according to an example embodiment of the present invention.

The operation of FIG. 15 may be performed at a predetermined time, for example, once per day or once per week. Further, as described above, information regarding the initial value and the upper limit value of power consumption is previously stored for each operation mode in the second storage unit 134 of the main controller 130, as illustrated in FIG. 13. Further, usage information that is used to estimate the lifetime of the subjected part is obtained using the counting method stored in the table illustrated in FIG. 14.

Referring to FIG. 15, at S101, the main controller 130 obtains the current value of power consumption for each one of the subjected part, and updates the table of FIG. 14 with the obtained current value of power consumption. In this example, as described above referring to FIG. 3, 4, or 6, the current value of power consumption is estimated based on the usage information that is obtained for the subjected part, using the relationship between power consumption and usage information. The relationship between power consumption and usage information may be stored, for example, in the form of graph, table, conversion formula, or set of coefficients. Further, in this example, the main controller 130 may obtain a specific usage-power consumption table or formula by referring to information stored in the table of FIG. 14, such as the usage-power consumption table or formula information or the lifetime counting method information.

At S102, the main controller 130 updates the current value of power consumption for each operation mode, based on the current values of power consumption obtained respectively for the subjected parts at S101.

In this example, for each of the subjected parts, information indicating whether to operate or stop the subjected part during a specific operation mode is previously stored, for example, as described above referring to FIG. 5. Alternatively, information regarding which one of the subjected parts operate for a specific operation mode is obtainable from a table storing part-specific power consumption information that is prepared for each operation mode, such as the table of FIG. 14 prepared for the copy mode. Based on this information regarding the operation state of the subjected part for each operation mode, the current value of power consumption of the image forming apparatus 100 is obtained for each operation mode, based on the current values of power consumption obtained for the subjected parts.

For example, in case of copy mode indicated by the table of FIG. 14, since all subjected parts are operated under the copy mode, the current values of power consumption obtained for all subjected parts are added together to obtain total power consumption of 462 W for the copy mode. The initial value of 390 W is subtracted from the current value of 462 W to obtain the increased value of power consumption, which is 72 W. This increased value of power consumption obtained for the subjected parts, which is 72 W, is added to the initial value of power consumption of the image forming apparatus obtained for the copy mode, which is 1200 W, to obtain the current value of power consumption for the image forming apparatus 100 under the copy mode, which is 1272 W. Once the current value of power consumption of the image forming apparatus 100 for the copy mode is obtained, this obtained value is stored in the table of FIG. 13. In a substantially similar manner, the current value of power consumption of the image forming apparatus 100 is obtained for other operation modes.

Referring back to FIG. 15, at S103, the main controller 130 determines whether the current value of power consumption for the specific operation mode exceeds the upper limit value that is previously determined. When it is determined that the current value of power consumption does not exceed the upper limit value ("NO" at S103), the operation ends. When it is determined that the current value of power consumption exceeds the upper limit value ("YES" at S103), the operation proceeds to S104.

At S104, the main controller 130 notifies the user that the current value of power consumption exceeds the upper limit value for the specific operation mode.

For example, assuming that the current value of power consumption of the image forming apparatus 100 for the copy mode is 1272 W, the main controller 130 compares the current value of 1272 W with the upper limit value of 1250 W. Since the comparison result indicates that the current value of power consumption exceeds the upper limit value, the image forming apparatus 100 determines to notify the user.

For example, the main controller 130 may cause the operation unit 109 to display a message indicating that power consumption needs to be reduced, information regarding the current value of power consumption and/or the remaining lifetime for each operation mode or for each subjected part, etc. Alternatively or additionally, the main controller 130 may send such information regarding power consumption through the LAN or the PSTN.

Information regarding power consumption, which may be sent by the image forming apparatus 100, may be received at an electric power monitoring server provided at the user site, or a management server provided at a management company that manages the image forming apparatus 100 such as a service center that provides various services to the user who is a customer. For example, when the server receives such information indicating that the image forming apparatus 100 exceeds the upper limit value of power consumption, the server refers to information regarding the current value of power consumption and the remaining lifetime obtainable from the table of FIG. 14. Based on the obtained information, the server determines which one of the subjected parts should be replaced, by analyzing various factors including whether replacement of a specific part contributes to the reduction in power consumption, or whether replacement of a specific part is cost effective, etc. For example, assuming that one of the Xenon lamps is replaced with a new one, information regarding the replaced Xenon lamp stored in the memory is updated to indicate that the lifetime is "0".

FIG. 16 illustrates an example table storing various information regarding the subjected part including information indicating the initial value of power consumption, information indicating a lifetime counting method, usage information indicating the lifetime, and information indicating the current value of power consumption. The table of FIG. 16 is obtained after the Xenon lamp is replaced with a new one such that information regarding the Xenon lamp is updated. More specifically, the usage information indicating the lifetime of the Xenon lamp is "0". The current value of power consumption is 120 W, which is the initial value of power consumption. Compared with information shown in the table of FIG. 14, the value of power consumption obtained for the subjected parts under the copy mode is reduced to 432 W. This indicates that, by replacing one of the subjected parts, the power consumption of the subjected parts for a specific operation mode is reduced.

Figures 17, 18:
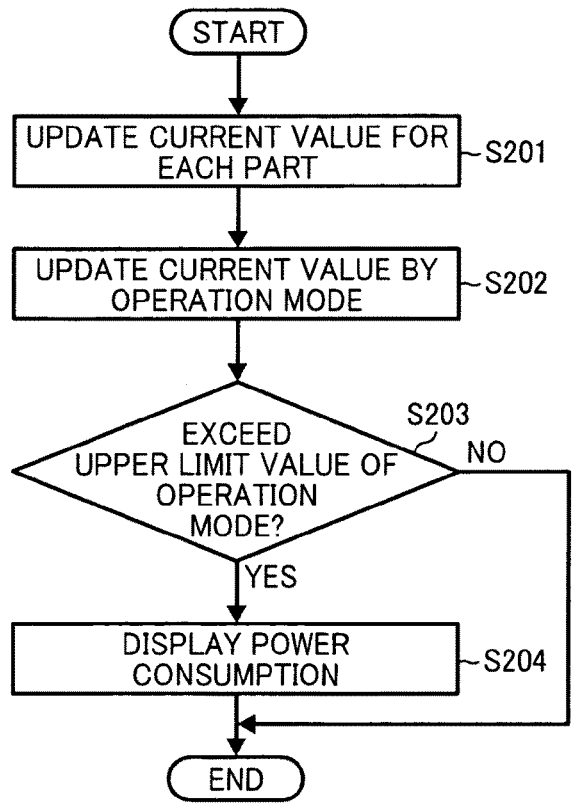
FIG. 17 is a table storing information regarding power consumption of the image forming apparatus of FIG. 1 for the copy mode, after the Xenon lamp is replaced.
FIG. 18 is a flowchart illustrating operation of managing power consumption of the image forming apparatus of FIG. 1 by operation mode, using part-specific power consumption information, according to an example embodiment of the present invention.

FIG. 17 illustrates an example table storing information regarding power consumption of the image forming apparatus 100 for the copy mode, which is obtained after replacement of the Xenon lamp. Referring to FIG. 17, as the Xenon lamp is replaced, the current value of power consumption for the copy mode, which was 1272 W before replacement as illustrated in FIG. 13, is now reduced to 1242 W. This indicates that, by replacement, the current value of power consumption of the image forming apparatus 100 is kept below the upper limit value of power consumption.

In the above-described example, the image forming apparatus 100 sends notification when the current value of power consumption exceeds the upper limit value to the user, for example, through the network. Alternatively, the image forming apparatus 100 may store information indicating that the current value of power consumption exceeds the upper limit value in the memory of the image forming apparatus 100. In such case, the server provided outside the image forming apparatus 100 may read out such information at a predetermined time, such as at the time of inspecting the image forming apparatus 100.

Further, at time of inspection, the outside server may obtain other information regarding the image forming apparatus 100 such as information indicating the current value of power consumption for each of the operation modes.

As described above, in the above-described example of managing power consumption by operation mode, the image forming apparatus 100 monitors the operation state of each of the subjected parts, that is, the accumulated operation amount information of each of the subjected parts. Based on the monitoring result, the image forming apparatus 100 obtains the current value of power consumption for each of the subjected parts under each of the operation modes based on the accumulated operation amount information. The image forming apparatus 100 further obtains the current value of power consumption of the entire image forming apparatus 100 for each of the operation modes, based on the current values of power consumption of the subjected parts obtained for each of the operation modes. Since the current value of power consumption is obtained by operation mode, the image forming apparatus 100 is able to provide information regarding power consumption in more details with improved accuracy, while allowing the user to select a countermeasure for reducing power consumption in a more efficient way. Further, the current value of power consumption may be further converted to the carbon dioxide emission. The user may set the upper limit value of power consumption based on the target value of carbon dioxide emission so as to keep the carbon dioxide emission below the target value.

Referring now to FIG. 18, operation of managing power consumption by operation mode, performed by the image forming apparatus 100, is explained according to an example embodiment of the present invention. The operation of FIG. 18 is substantially similar to the operation of FIG. 15, except that more detailed information regarding power consumption is displayed to the user.

S201, S202, and S203 are respectively performed in a substantially similar manner as described above referring to S101, S102, and S103 of FIG. 15.

At S203, when it is determined that the current value of power consumption obtained for the specific operation mode exceeds the upper limit value ("YES" at S203), the operation proceeds to S204 to display information regarding the power consumption of the image forming apparatus 100 through the operation unit 109.

Figure 9:
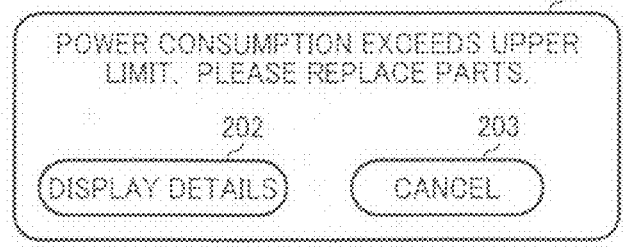
FIG. 9 is an example screen displayed by the image forming apparatus of FIG. 1, when the current value of power consumption exceeds the upper limit value.

For example, the operation unit 109 may display the screen 201 of FIG. 9 to notify the user that the current value of power consumption exceeds the upper limit value. The screen 201 may be displayed at a selected portion of the LCD of the operation unit 109 as one of windows, for example, at the time when the image forming apparatus 100 determines that the current value of power consumption exceeds the upper limit value. When the "DISPLAY DETAILS" button 202 is pressed by the user, the operation unit 109 displays a replaceable parts information screen 600 of FIG. 19.

Figure 19:
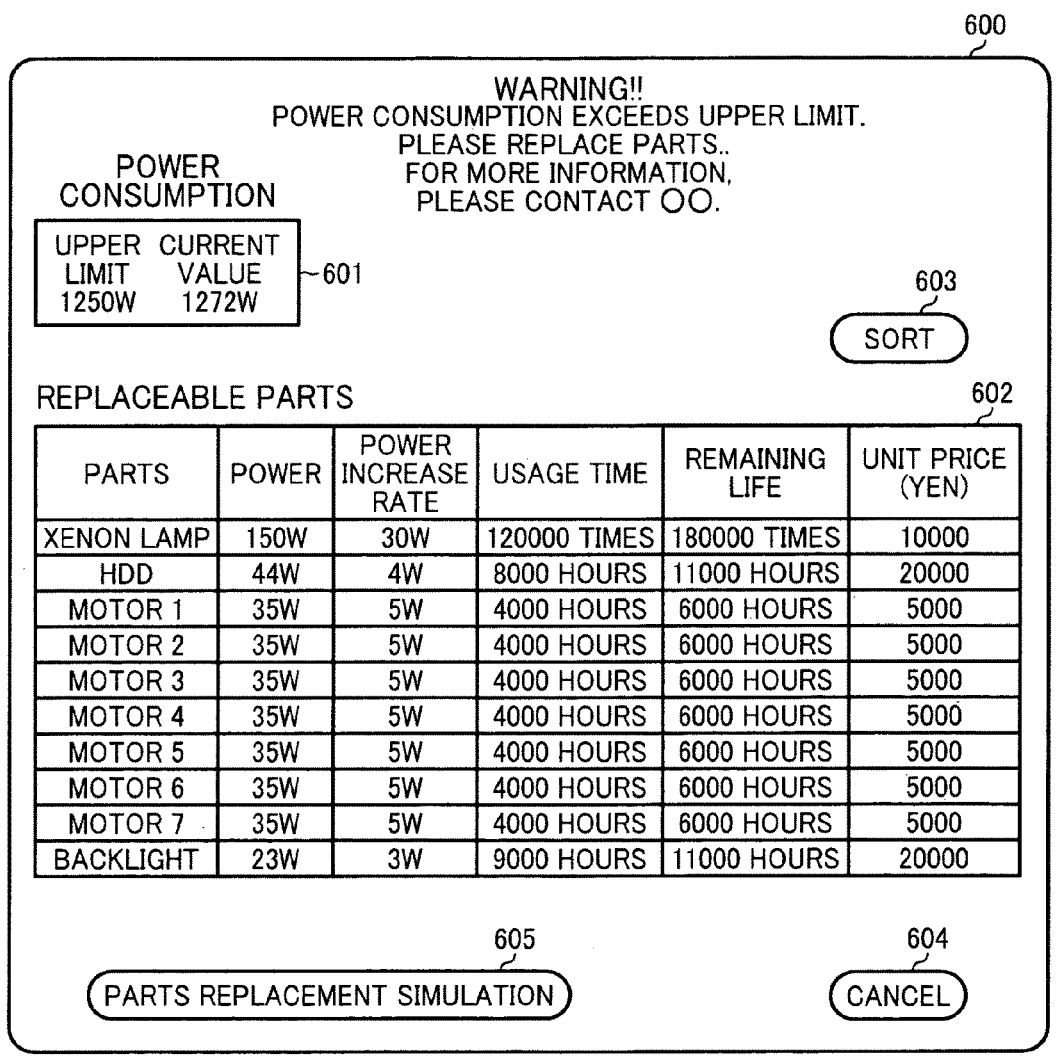
FIG. 19 is an example screen displayed by the image forming apparatus of FIG. 1.

The replaceable parts information screen 600 of FIG. 19 includes a power consumption display section 601, a replaceable parts list 602, a "SORT" button 603, a "CANCEL" button 604, and a "PARTS REPLACEMENT SIMULATION" button 605. The power consumption display section 601 displays the upper limit value and the current value of power consumption of the image forming apparatus 100 for a specific operation mode. In this example, the upper limit value and the current value of power consumption for the copy mode is displayed based on information obtained from the table of FIG. 13. The replaceable parts list 602 lists the parts subjected for monitoring with various information regarding the subjected parts, which may be obtained from the table of FIG. 14. By pressing the "SORT" button 603, the user is able to sort information contained in the replaceable parts list 602, for example, in an order determined based on the current value of power consumption, the value of increased power consumption, the remaining lifetime, the unit price, the parts name, etc.

When the "PARTS REPLACEMENT SIMULATION" button 605 is pressed, the operation unit 109 displays a parts replacement simulation screen that displays information indicating the estimated value of power consumption when at least one of the replaceable parts listed in the replaceable parts list 602 is replaced with a new one.

FIG. 20 illustrates an example parts replacement simulation screen 610, which includes a power consumption display section 611, a replaceable parts list 612, a "SORT" button 613, a "CANCEL" button 614, and a price display section 615.

By pressing the "SORT" button 613, the user is able to sort information contained in the replaceable parts list 612, for example, in an order determined based on the current value of power consumption, the value of increased power consumption, the remaining life, the unit price, the parts name, etc. In this example, the left column of the replaceable parts list 612 that corresponds to the parts name of the replaceable part can be selected. When one of the cells is selected, the selected cell is highlighted. Further, the main controller 130 updates various information regarding the selected part by estimating various information that are assumed to be obtained after the selected part is replaced with a new one. For example, when the Xenon lamp is selected as shown in FIG. 20, updated information regarding the Xenon lamp is displayed to the user such as the updated value of power consumption that is set at 120 W, the updated value of increased power consumption that is set at 0 W, the updated unit price of the new Xenon lamp that is replaced, etc. As illustrated in FIG. 20, the power consumption display section 611 additionally displays the estimated value of power consumption, which would be obtained after the Xenon lamp is replaced with a new one. The price display section 615 displays a total price that is required for parts replacement, in this example, the price of a new Xenon lamp.

The power consumption display section 611 of the screen 610 indicates that, by replacing the Xenon lamp, the value of power consumption of the image forming apparatus 100 for the copy mode would be 1242 W, which is below the upper limit value of 1250 W. In addition to selecting the Xenon lamp, the user may further select any desired number of parts listed in the replaceable parts list 612 to estimate how far the power consumption could be reduced.

FIG. 21 illustrates an example parts replacement simulation screen 610, which is displayed to the user when the motor 1 is selected from the replaceable parts list 612 in addition to the Xenon lamp. Referring to the power consumption display section 611 of FIG. 21, if the motor 1 is replaced with a new one, the power consumption would be further reduced by 5 W. The price display section 615 of the screen 610 shown in FIG. 21 indicates that the price required for replacement is now 15,000 Yen.

The parts replacement simulation screen of FIG. 20 or 21 may be displayed in various other ways. For example, the power consumption display section 611 of the screen 610 may display information regarding the upper limit value, the current value, and the updated value of power consumption in the form of graph such as bar graph or line graph.

FIG. 22 illustrates an example parts replacement simulation screen 610, which displays information regarding power consumption in the form of bar graph. Compared with the screen 610 shown in FIG. 20 or 21, the parts replacement simulation screen 610 further includes a replaced parts list section 617 that lists the Xenon lamp and the motor 1, which are selected by the user to be replaced.

Further, in any one of the screens 610 of FIGS. 20, 21, and 22, it is assumed that the screen 610 displays the values of power consumption for a specific operation mode such as the copy mode. Alternatively, the screen 600 may display the average value of power consumption that is obtained from more than one operation mode.

Based on information displayed on the parts replacement simulation screen of any one of FIGS. 20 to 22, the user may actually order one or more parts of the image forming apparatus 100. For example, when the Xenon lamp and the motor 1 are to be replaced according to the simulation results, the updated information regarding the Xenon lamp and the motor 1 are stored in the memory such as the second storage unit 134. More specifically, the table of FIG. 13 and the table of FIG. 14 are respectively updated to reflect the updated information.

In alternative to managing power consumption of the image forming apparatus 100 by part or by operation mode, the image forming apparatus 100 may manage power consumption by its total power consumption value.

Figure 23:
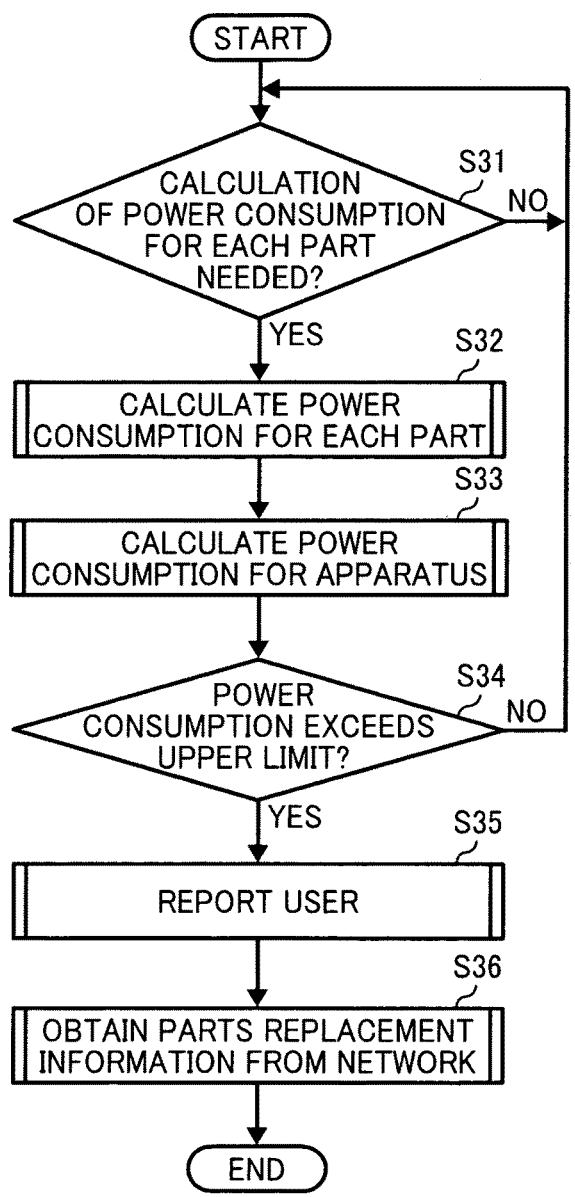
FIG. 23 is a flowchart illustrating operation of managing power consumption of the image forming apparatus of FIG. 1 by its total power consumption value, using part-specific power consumption information, according to an example embodiment of the present invention.

Referring now to FIG. 23, operation of managing power consumption of the image forming apparatus 100, by its total power consumption value, is explained according to an example embodiment of the present invention.

S31, S32, S35, and S36 are respectively performed in a substantially similar manner as described above referring to S11, S12, S14, and S15 of FIG. 8. Referring to FIG. 8, the image forming apparatus 100 notifies the user when there is at least one part that exceeds the upper limit value of power consumption. In this example illustrated in FIG. 23, the image forming apparatus 100 notifies the user when the total power consumption value of the image forming apparatus 100 exceeds the upper limit value.

At S33, the main controller 130 adds the current values of power consumption respectively obtained for the subjected parts to obtain the sum of power consumption for the parts subjected for monitoring. The obtained sum is further added to the value of power consumption for the other parts, which are assumed to be unchanged, to obtain the total power consumption value of the image forming apparatus 100, for example, as described above referring to the case of calculating the value of power consumption for a specific operation mode.

At S34, the main controller 130 determines whether the total power consumption value exceeds the upper limit value of the image forming apparatus 100 that is previously set. When it is determined that the total power consumption value exceeds the upper limit value ("YES" at S34), the operation proceeds to S35. When it is determined that the total power consumption value does not exceed the upper limit value ("NO" at S34), the operation returns to S31.

At S35, the main controller 130 causes the operation unit 109 to notify the user that the current value of total power consumption of the image forming apparatus 100 exceeds the upper limit value. In this example, the upper limit value is treated the same for all operation modes of the image forming apparatus 100. Accordingly, when there is at least one operation mode that has exceeded the upper limit value, the main controller 130 determines that the total power consumption value of the image forming apparatus 100 exceeds the upper limit value. Alternatively, the image forming apparatus 100 may obtain the current value of power consumption of the entire image forming apparatus 100 by averaging the current values of power consumption of the entire image forming apparatus 100 obtained for more than operation modes.

Further, at S35, the main controller 130 may cause the operation unit 109 to display a replaceable parts information screen, which is substantially similar to the screen 600 of FIG. 19. Instead of displaying the value of power consumption that is obtained for a specific operation mode, the replaceable parts information screen displays the total power consumption value of the entire image forming apparatus 100.

In this example described above referring to FIG. 23, the image forming apparatus 100 is provided with a function of calculating the current value of power consumption that is consumed by the image forming apparatus 100. Using this function, the image forming apparatus 100 keeps power consumption of the image forming apparatus 100 below a predetermined value of power consumption, which is previously set. For example, when the predetermined value of power consumption is set at 1500 W, measured at a voltage of 100V and a current of 15 A, the power consumption of the image forming apparatus 100 is kept below this predetermined value by requesting the user to replace one or more parts of the image forming apparatus 100 when the power consumption exceeds this predetermined value.

Further, when requesting the user to replace one or more parts, the image forming apparatus 100 provides detailed information regarding the parts to be replaced. With this detailed information, the user is able to easily make a decision regarding one or more parts to be replaced.

Further, the image forming apparatus 100 provides detailed information regarding which part of the image forming apparatus 100 mostly contributes to the reduction in power consumption.

As described above throughout the specification, the image forming apparatus 100 is capable of managing power consumption by each part subjected for monitoring, by each operation mode of the image forming apparatus 100, or by its total power consumption value. The image forming apparatus 100 may select one of these methods of managing power consumption according to a user instruction input through the operation unit 109.

[Adjusting Usage Information]

In any one of the above-described operations of managing power consumption, usage information or operation amount information obtained for each subjected part may be adjusted depending on a condition under which each subjected part is used or operated. For example, depending on temperature or humidity, the subjected part may degrade at a faster rate such that the increase in power consumption may be accelerated. In order to improve accuracy in power consumption estimation, such environmental conditions may also be considered. For example, temperature or humidity within the image forming apparatus 100 may be detected using the temp/hum sensor 151 of FIG. 2. Using detected information, the lifetime of the subjected part may be estimated based on the usage information as well as the detected temperature or humidity.

For example, when the detected temperature exceeds a predetermined threshold, the value of lifetime may be adjusted by multiplying a coefficient that is determined based on the detected temperature. Assuming that the detected temperature within the image forming apparatus 100 exceeds the threshold of 50 degrees Celsius, the usage time of 1 hour that is obtained for the motor part is further multiplied by 1.2 to obtain the adjusted usage time of 1.2 hours. The current value of power consumption is thus obtained using the adjusted usage time of 1.2 hours. This method of adjusting the usage information based on the temperature is applicable to any type of subjected part such as the lamp part or the HDD part.

In another example, the usage or operation amount information may be adjusted based on an environmental factor, which indicates the degree of negative influence caused by a certain environmental condition onto the lifetime of a subjected part. As the increased rate of power consumption for the subjected part varies due to various usage conditions such as environmental conditions, power consumption of the subjected part is adjusted based on the environmental factor. The environmental factor specifies a certain environmental condition by temperature, humidity, overall usage time, etc., as illustrated in FIG. 24. In FIG. 24, the higher value of environmental factor reflects the severe environmental condition under which power consumption tends to increase at a higher rate, and the lower value of environmental factor reflects the normal environmental condition under which power consumption increases at a standard rate.

Referring to FIG. 24, with high temperature and humidity values, it is known that power consumption of the subjected part tends to increase. For this reason, the environmental factors increases as temperature and humidity values increase. Further, it is known that power consumption of the subjected part tends to increase with the longer usage time. For example, as a sheet transfer roller or a gear is worn out, more frictional force is generated such that more electric power may be needed to perform the same type of work. Further, toner that is accidentally introduced into the subjected part may be accumulated in the subjected part as time progresses, causing degradation in the subjected part. For this reason, the environmental factor increases as the usage time increases. In addition to temperature, humidity, and usage time, any other conditions may be considered, for example, atmosphere pressure. It is known that, with the increase in atmosphere pressure, more electric power consumption is needed as the subjected part would degrade at a higher rate due to high pressure applied to the subjected part.

At the time of obtaining the current value of power consumption, the main controller 130 obtains environmental data including temperate or humidity detected by the temp/hum sensor 151 and a number of years used that is stored in the memory such as the storage unit 134. The main controller 130 further obtains environmental factors that respectively correspond to the obtained environmental data by referring to information stored in the table of FIG. 24. Once the total value of environmental factors, which are added values of environmental factors, is obtained, the main controller 130 refers to a table of FIG. 25 that indicates the relationship between a correction coefficient and a total value of environmental factors to obtain the correction coefficient that corresponds to the obtained total value of environmental factors. Referring to FIG. 25, the total value of environmental factors are classified into five levels including the range 0, range 1 to 3, range 4 to 6, range 7 to 9, and range 10 or more. As the total value of environmental factors increases by one level, a correction coefficient is increased by 5 percent, or 0.05.

Figure 26:
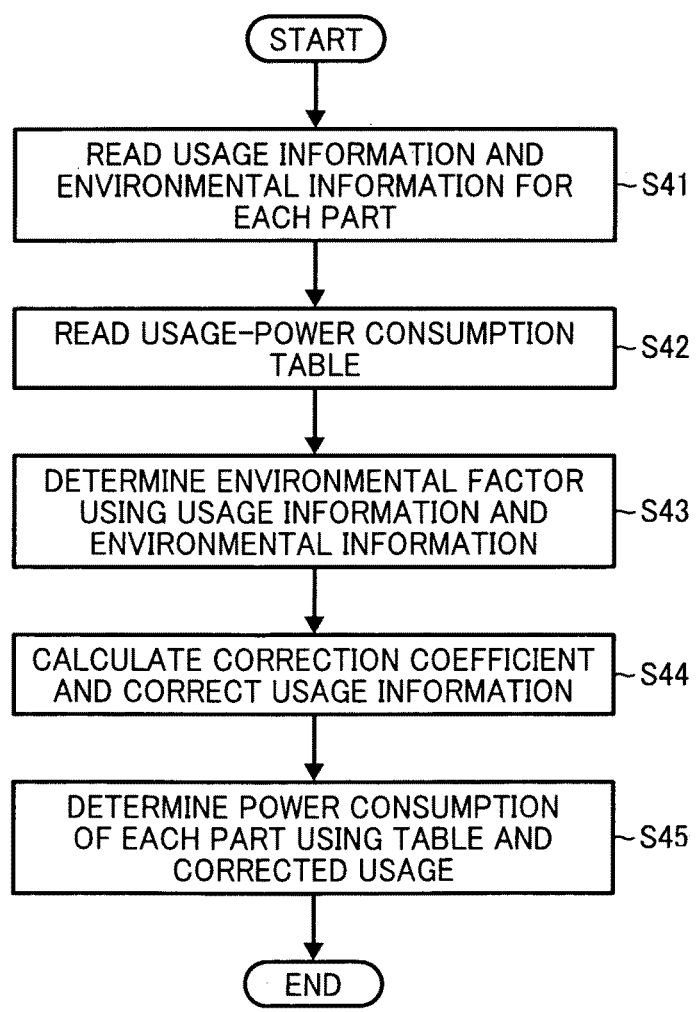
FIG. 26 is a flowchart illustrating operation of managing power consumption of the image forming apparatus of FIG. 1, using part-specific power consumption information obtained based on corrected operation amount information that is corrected based on environmental factors, according to an example embodiment of the present invention.

Referring now to FIG. 26, operation of obtaining the current value of power consumption using a corrected value of usage information is explained according to an example embodiment of the present invention.

At S41, the main controller 130 reads usage information such as a number of times the subjected part is used or operated or a time during which the subjected part is used or operated, and environmental data that reflects the environmental condition under which the subjected part is used or operated, from the second storage unit 134.

At S42, the main controller 130 reads a usage-power consumption table for the subjected part from the second storage unit 134.

At S43, the main controller 130 refers to the table of FIG. 24 to obtain the total value of environmental factors using the environmental data obtained at S41.

At S44, the main controller 130 refers to the table of FIG. 25 to obtain a correction coefficient that corresponds to the total value of environmental factors obtained at S43. Using the correction coefficient obtained from the table of FIG. 25, the main controller 130 corrects the usage information obtained at S41.

At S45, the main controller 130 refers to the usage-power consumption table obtained at S43 to obtain the current power consumption that corresponds to the corrected usage information obtained at S44, and the operation ends.

For the descriptive purpose, an example case of obtaining the current value of power consumption for the motor part is explained. It is assumed that, at the time of power consumption estimation, the overall time during which the motor part is used is 3000 hours. Using the temp/hum sensor 150, a temperature of 30 degrees Celsius and a humidity of 70% are obtained. Further, the motor part is used for 2 years.

Using the graph of FIG. 4, the power consumption that corresponds to the driven time of 3000 hours is 115 W. Referring to FIG. 24, the environmental factor for the temperature of 30 degrees Celsius is plus 2. The environmental factor for the humidity of 70% is plus 2. The environmental factor for the 2 year usage time is plus 1. The total value of environmental factors is thus, 2+2+1=5. Referring to FIG. 25, a correction coefficient that corresponds to the total value of environmental factors of 5 is 1.10. The corrected usage information is thus, 3000 hours*1.10=3300 hours. Referring to FIG. 4 or 6, the power consumption that corresponds to the driven time of 3300 hours is 130 W. Accordingly, the current value of power consumption for the motor that is driven for 3000 hours is 130 W, when environmental condition is considered.

In any one of the above-described methods of managing power consumption, the image forming apparatus 100 stores various information regarding usage information and power consumption in a memory provided in the image forming apparatus 100 such as the second storage unit 134, the first storage unit 141, or the 2HDD 131. For example, various information stored in the table of FIG. 14 or 16 may be stored in the storage unit 134.

Referring to FIGS. 14 and 16, at the time of replacing a part with a new part or a used part, the current lifetime is reset to the value 0, and the current value of power consumption is reset to the initial value that is previously set at the time of shipping. In this manner, information regarding the subjected parts that is stored in the memory of the image forming apparatus 100 is kept updated even after the part is replaced. However, in case when the part is replaced with a part having a different model such as a high quality model, the user is required to manually update various information regarding the newly installed part using the operation unit 109 as the different model has different characteristics such as a different initial value of power consumption. Alternatively, the image forming apparatus 100 may obtain necessary information through a network to update information stored in the table of FIG. 14.

In view of the above, any one of the parts subjected for monitoring may have an ID chip that stores therein information regarding the particular part such as usage information of the particular part.

In case when the part is a new one, the ID chip of the part is initialized when the part is installed onto the image forming apparatus 100 such that the usage information is set to the initial value. In case when the part is a used one, the ID chip of the part keeps the previously stored value of usage information even after the part is installed onto the image forming apparatus 100. The main controller 130 of the image forming apparatus 100 determiners whether the part that is installed is new or used by referring to flag data of 1 or 0, which is stored in a data area of the ID chip of the part. When the part that is installed is newly manufactured, the data area of the ID chip includes flag data of 0. In such case, the main controller 130 initializes the usage information in the ID chip to have the initial value, and rewrites the flag data of the ID chip to 1. When the part that is installed is a used part, the data area of the ID chip includes flag data of 1. In such case, the main controller 130 does not initialize the usage information stored in the ID chip. In addition to determining whether the part that is installed is new or used, the main controller 130 may specify a model of the part that is installed, for example based on the initial value of usage information. The model of the part may be classified into an economical model, standard model, and high quality model.

By providing the ID chip to each one of the subjected parts, information regarding the subjected part can be easily managed with improved efficiency and accuracy. For example, even when a part having a model different from a model of a previously installed part is installed, usage information does not have to be manually entered by the user. Further, the memory requirement for the image forming apparatus 100 is reduced, as there is no need to have a data area in the memory of the image forming apparatus 100 for storing various information regarding the subjected part.

Further, in addition to the usage information and the flag data described above, any other information regarding one or more parts of the image forming apparatus 100 may be stored in the respective ID chips of the parts. Referring back to FIG. 14, the subjected parts listed in the table of FIG. 14 may be respectively provided with the IC chips, each of which storing information regarding the initial value of power consumption, the cost, the lifetime counting method, the usage-power consumption table or conversion, and the current lifetime. The current value of power consumption may be written in a data area of the ID chip or stored in a memory of the image forming apparatus 100 as a calculation result obtained from the current lifetime and the usage-power consumption table. Further, the IC chip may additionally store any other desired information such as a formula used for correcting the lifetime value based on environmental data, or a correction coefficient for correcting the lifetime value based on an environmental factor that is obtained based on the environmental data.

In order to use various information stored in the ID chip of the subjected part for power consumption estimation, when the power of the image forming apparatus 100 is turned on, the main controller 130 accesses the ID chip of each of the subjected part to read information stored in the ID chip. At this time, the main controller 130 may only obtain necessary information, for example, when the main controller 130 stores information previously obtained from the ID chip in a memory of the image forming apparatus 100. The information read by the main controller 130 is stored in a memory such as the RAM for further processing by the main controller 130.

In order to keep various information stored in the ID chip of the subjected part updated, the main controller 130 of the image forming apparatus 100 stores the mostly updated information in the ID chip of the subjected part, for example, at the process of shutting down before the image forming apparatus 100 is turned off. For example, the main controller 130 updates the previously obtained value of lifetime stored in the data memory of the ID chip with the current lifetime that is stored in the RAM of the image forming apparatus 100. In addition to the current lifetime, the main controller 130 may update the previously obtained value of power consumption stored in the data memory of the ID chip with the current value of power consumption stored in the RAM of the image forming apparatus 100.

In the above-described example, it is assumed that the updated information is written in the ID chip when the power of the image forming apparatus 100 is turned off. Alternatively, updated information may be written in the ID chip of the subjected part at any desired time, for example, at a predetermined time previously set by the user.

As described above throughout the specification, the image forming apparatus 100 is provided with a controller, such as the main controller 130, which performs operation of managing power consumption of the image forming apparatus 100 according to a control program. More specifically, upon execution, the control program causes the controller to have a plurality of functional modules to perform a plurality of functions.

In one example, the controller provides a function of generating, for each one of the parts, accumulated operation amount information based on an operation state of the part, a function of obtaining part-specific power consumption information for each one of the parts based on the accumulated operation amount information obtained for each one of the parts, and a function of providing a user, through a user interface, with power consumption information generated based on the part-specific power consumption obtained for each one of the parts. The power consumption information indicates an amount of electric power consumed by at least a portion of the image forming apparatus.

In one example, the controller is further provided with a function of obtaining environmental data from a sensor, and a function of correcting the accumulated operation amount information obtained for each one of the parts based on the environmental data. The part-specific power consumption information is obtained based on the corrected accumulated operation amount information.

In one example, the controller is further provided with a function of comparing the amount of electric power consumed by each one of the parts with an upper limit value of power consumption that is previously determined for each one of the parts to generate a comparison result, and a function of determining whether to provide the power consumption information based on the comparison result.

In one example, the controller is further provided with a function of calculating an amount of electric power consumed by the entire image forming apparatus based on the part-specific power consumption information obtained for each one of the parts, and a function of comparing the amount of electric power consumed by the entire image forming apparatus with an upper limit value of power consumption that is previously determined for the entire image forming apparatus to generate a comparison result. The controller further determines whether to provide the power consumption information based on the comparison result.

Numerous additional modifications and variations are possible in light of the above teachings. It is therefore to be understood that within the scope of the appended claims, the disclosure of the present invention may be practiced otherwise than as specifically described herein.

With some embodiments of the present invention having thus been described, it will be obvious that the same may be varied in many ways. Such variations are not to be regarded as a departure from the spirit and scope of the present invention, and all such modifications are intended to be included within the scope of the present invention.

For example, elements and/or features of different illustrative embodiments may be combined with each other and/or substituted for each other within the scope of this disclosure and appended claims.

Further, as described above, any one of the above-described and other methods of the present invention may be embodied in the form of a computer progrim stored in any kind of storage medium. Examples of storage mediums include, but are not limited to, flexible disk, hard disk, optical discs, magneto-optical discs, magnetic tapes, involatile memory cards, ROM (read-only-memory), etc.

Alternatively, any one of the above-described and other methods of the present invention may be implemented by ASIC, prepared by interconnecting an appropriate network of conventional component circuits or by a combination thereof with one or more conventional general purpose microprocessors and/or signal processors programmed accordingly.

In one example, the present invention may reside in: an image forming apparatus including: operation amount information generating means for monitoring an operation state of a part and generating accumulated operation amount information of the part based on the operation state; first power consumption calculating means for calculating power consumption of the part that is estimated to be consumed by the part when the accumulated operation amount information is generated for the part, based on the accumulated operation amount information, and correspondence information indicating the correspondence between the accumulated operation amount information and power consumption values that is previously obtained; first determining means for determining whether the power consumption calculated by the first power consumption calculating means is greater than a predetermined threshold to generate a determination result; and first reporting means for reporting power consumption information regarding the power consumption of the part based on the determination result generated by the first determining means.

In one example, when the first determination means determines that the power consumption calculated by the first power consumption calculating means is greater than the predetermined threshold, the power consumption information reported by the first reporting means includes notification that the power consumption of at least one part exceeds the predetermined threshold.

In one example, the power consumption information reported by the first reporting means includes the current value of power consumption of the at least one part.

In one example, the image forming apparatus further includes: second power consumption calculating means for calculating power consumption of the entire image forming apparatus based on power consumption values of a plurality of parts calculated by the first power consumption calculating means; second determining means for determining whether the power consumption of the entire image forming apparatus calculated by the second power consumption calculating means is greater than a predetermined threshold to generate a determination result; and second reporting means for reporting power consumption information regarding the power consumption of the entire image forming apparatus based on the determination result generated by the second determining means.

In one example, the operation state of the part for monitoring includes an accumulated number of times the part is operated or an accumulated time during which the part is operated, counted from a time when the part is installed or replaced.

In one example, the image forming apparatus further includes: usage environment condition obtaining means for monitoring a usage environment condition under which the image forming apparatus is operated; and means for correcting the accumulated operation amount information according to the usage environment condition.

In one example, the power consumption information regarding the power consumption of the part reported by the first reporting means includes a request for replacement of the part having the power consumption that exceeds the predetermined threshold.

In one example, the request for replacement of the part is output in the form of list of one or more parts having the power consumption that exceeds the predetermined threshold.

In one example, the image forming apparatus further includes: an operation amount information memory storing the operation amount information; and means for initializing the operation amount information of the part stored in the memory when the part is replaced with a replacing part In one example, the operation amount information memory is an ID chip attached to the part.

In one example, the image forming apparatus further includes: means for determining whether the replacing part that replaces the part is a used part based on information stored in the ID chip; and means for prohibiting the process of initializing to be executed when the replacing part is a used part.

In one example, the present invention may reside in: a method of monitoring power consumption of an image forming apparatus including: monitoring an operation state of a part to generate an accumulated operation amount information of the part; calculating power consumption of the part that is estimated to be consumed when the accumulated operation amount information is generated, based on the accumulated operation amount information and correspondence information indicating the correspondence between the accumulated operation amount information and power consumption values that is previously obtained; determining whether the power consumption is greater than a predetermined threshold to generate a determination result; and reporting information regarding the power consumption of the part based on the determination result.

In one example, the present invention may reside in: an image forming apparatus that operates under a plurality of operation modes. The image forming apparatus includes: part-specific operation amount obtaining means for monitoring an operation state of a part and obtaining a monitoring result as an accumulated operation amount; power consumption estimating means for estimating power consumption of the part that is estimated to be consumed when the accumulated operation amount is generated, based on the correspondence between an accumulated operation amount and power consumption that is previously determined; power consumption information storing means for storing at least a current value of power consumption that is periodically updated based on the power consumption of the part estimated by the power consumption estimating means and an upper limit value of power consumption that is previously determined; and means for reporting information regarding the power consumption to the user, based on a comparison between the current value of power consumption and the upper limit value of power consumption.

In one example, the image forming apparatus further includes: means for determining whether the current value of power consumption stored in the power consumption information storing means exceeds the upper limit value. The reporting means reports the information regarding power consumption when the means for determining determines that the current value of power consumption exceeds the upper limit value.

In one example, the information regarding the power consumption reported by the reporting means includes a current value of power consumption.

In one example, the information regarding the power consumption reported by the reporting means includes notification that reduction in power consumption is necessary.

In one example, the image forming apparatus further includes: means for determining whether the current value of power consumption stored in the power consumption information storing means exceeds the upper limit value. The reporting means sends a request for replacement of one or more parts of the image forming apparatus when the means for determining determines that the current value of power consumption exceeds the upper limit value.

In one example, the request for replacement of one or more parts includes a list of replaceable parts and an accumulated operation amount of each of the replaceable parts.

In one example, the reporting means lists the replaceable parts according to a predetermined number of orders.

In one example, the predetermined number of orders may be changed such that the order is determined by parts name, the degree of degradation estimated from the accumulated operation amount, the degree of contribution to power consumption reduction estimated from parts replacement, or parts cost.

In one example, the image forming apparatus further includes: means for selecting one or more parts listed in the parts, list; and means for reporting the degree of contribution to power consumption reduction estimated from the parts cost, power consumption, and parts replacement.

In one example, the image forming apparatus further includes: means for updating information regarding the power consumption of the part stored in the power consumption information storing means when the part is replaced with a replacing part.

In one example, the operation state of the part monitored by the part-specific operation amount obtaining means includes at least one of a number of times the part is operated, a time during which the part is operated, and an environment under which the part is operated.

In one example, the image forming apparatus further includes an ID chip having a memory, that is attached to the part. The memory of the ID chip stores the accumulated operation amount, the correspondence between the accumulated operation amount of the part and power consumption that is previously determined, and the power consumption of the part estimated by the power consumption estimating means.

In one example, the present invention may reside in: a method of monitoring power consumption of an image forming apparatus that operates under a plurality of operation modes. The method includes: monitoring an operation state of a part and obtaining a monitoring result as an accumulated operation amount; estimating power consumption of the part that is estimated to be consumed when the accumulated operation amount is generated, based on the correspondence between an accumulated operation amount and power consumption that is previously determined; storing at least a current value of power consumption that is periodically updated based on the power consumption of the part and an upper limit value of power consumption that is previously determined; and reporting information regarding the power consumption to the user, based on a comparison between the current value of power consumption and the upper limit value of power consumption.

In one example, the present invention may reside in: an image forming apparatus including: one or more parts selected for monitoring; means for generating, for each one of the parts, accumulated operation amount information based on an operation state of the part; means for obtaining part-specific power consumption information for each one of the parts based on the accumulated operation amount information obtained for each one of the parts, the part-specific power consumption information indicating an amount of electric power consumed by each one of the parts; and means for providing a user with power consumption information generated based on the part-specific power consumption information obtained for each one of the parts, the power consumption information indicating an amount of electric power consumed by at least a portion of the image forming apparatus.

In one example, the operation state of the part includes at least one of: an accumulated number of times the part is operated, counted from a time when the part is installed or replaced; and an accumulated time during which the part is operated, counted from a time when the part is installed or replaced.

In one example, the image forming apparatus further includes: means for monitoring an environmental condition under which the image forming apparatus is operated to output a monitoring result as environmental data; and means for correcting the accumulated operation amount information obtained for each one of the parts based on the environmental data, wherein the part-specific power consumption information is obtained based on the corrected accumulated operation amount information.

In one example, the means for providing compares the amount of electric power consumed by each one of the parts with an upper limit value of power consumption that is previously determined for each one of the parts to generate a comparison result, and determines whether to provide the power consumption information based on the comparison result.

In one example, the power consumption information provided by the means for providing includes the part-specific power consumption information obtained for each one of the parts.

In one example, the power consumption information provided by the means for providing includes information indicating that the amount of electric power consumed by at least one of the parts exceeds the upper limit value of power consumption previously determined for the at least one of the parts.

In one example, the power consumption information provided by the means for providing further includes information requesting the user to replace the at least one of the parts having the amount of electric power that exceeds the upper limit value of power consumption.

In one example the image forming apparatus further includes: means for calculating an amount of electric power consumed by the entire image forming apparatus based on the part-specific power consumption information obtained for each one of the parts. The means for providing compares the amount of electric power consumed by the entire image forming apparatus with an upper limit value of power consumption that is previously determined for the entire image forming apparatus to generate a comparison result, and determines whether to provide the power consumption information based on the comparison result.

In one example, the amount of electric power consumed by the entire image forming apparatus is calculated for each one of a plurality of operation modes of the image forming apparatus.

In one example, the power consumption information provided by the means for providing includes the amount of electric power consumed by the entire image forming apparatus.

In one example, the power consumption information provided by the means for providing includes information indicating that the amount of electric power consumed by the entire image forming apparatus exceeds the upper limit value of power consumption previously determined for the entire image forming apparatus.

In one example, the power consumption information provided by the means for providing further includes information requesting the user to replace at least one of the parts of the image forming apparatus.

In one example, the information requesting the user to replace at least one of the parts includes at least one of: a replaceable part selected from the one or more parts for monitoring; the accumulated operation amount information of the replaceable part; a cost of the replaceable part; the degree of contribution to power consumption reduction caused by replacement of the replaceable part; and the amount of electric power consumed by the replaceable part.

What is claimed is:

1. An image forming apparatus, comprising:
   one or more parts selected for monitoring, the one or more parts being internal components of the image forming apparatus; and
   a controller configured to,
   manage power consumption of the image forming apparatus;
   generate, for each one of the parts, accumulated operation amount information based on an operation state of the part, the accumulated operation amount information being a metric of an accumulated amount of wear that the part has been subjected to since the part was installed in the image forming apparatus;
   obtain, for each one of the parts, part-specific power consumption information using the generated accumulated operation amount information for the part and an estimate of an amount of electric power consumed by the part, the part-specific power consumption information indicating an amount of electric power consumed by the part; and
   provide a user, through a user interface, with power consumption information generated based on the part-specific power consumption information obtained for each one of the parts, the power consumption information indicating an amount of electric power consumed by one or more of the one or more parts that are internal components of the image forming apparatus.

2. The image forming apparatus of claim 1, wherein the operation state of the part includes at least one of:
   an accumulated number of times the part is operated, counted from a time when the part is installed or replaced; and
   an accumulated time during which the part is operated, counted from a time when the part is installed or replaced.

3. The image forming apparatus of claim 1, further comprising:
   a sensor configured to monitor environmental conditions under which the image forming apparatus is operated to output a monitoring result as environmental data,
   wherein the controller is further configured to correct the accumulated operation amount information obtained for each one of the parts based on the environmental data, and to obtain the part-specific power consumption information based on the corrected accumulated operation amount information.

4. The image forming apparatus of claim 1, wherein the controller is further configured to compare the amount of electric power consumed by each one of the parts with an upper limit value of power consumption that is previously determined for each one of the parts to generate a comparison result, and to determine whether to provide the power consumption information based on the comparison result.

5. The image forming apparatus of claim 4, wherein the power consumption information provided by the controller includes the part-specific power consumption information obtained for each one of the parts.

6. The image forming apparatus of claim 4, wherein the power consumption information provided by the controller includes information indicating that the amount of electric power consumed by at least one of the parts exceeds the upper limit value of power consumption previously determined for the at least one of the parts.

7. The image forming apparatus of claim 6, wherein the power consumption information provided by the controller further includes information requesting the user to replace the at least one of the parts having the amount of electric power that exceeds the upper limit value of power consumption previously determined for the at least one of the parts.

8. The image forming apparatus of claim 1, wherein the controller is further configured to:

calculate an amount of electric power consumed by an entirety of the image forming apparatus based on the part-specific power consumption information obtained for each one of the parts;

compare the amount of electric power consumed by the entirety of the image forming apparatus with an upper limit value of power consumption that is previously determined for the entirety of the image forming apparatus to generate a comparison result; and determine whether to provide the power consumption information based on the comparison result.

9. The image forming apparatus of claim 8, wherein the amount of electric power consumed by the entirety of the image forming apparatus is calculated for each one of a plurality of operation modes of the image forming apparatus.

10. The image forming apparatus of claim 8, wherein the power consumption information provided to the user by the controller includes the amount of electric power consumed by the entirety of the image forming apparatus.

11. The image forming apparatus of claim 8, wherein the power consumption information provided by the controller includes information indicating that the amount of electric power consumed by the entirety of the image forming apparatus exceeds the upper limit value of power consumption previously determined for the entirety of the image forming apparatus.

12. The image forming apparatus of claim 11, wherein the power consumption information provided by the controller further includes information requesting the user to replace at least one of the parts of the image forming apparatus.

13. The image forming apparatus of claim 12, wherein the information requesting the user to replace at least one of the parts includes at least one of:

identity of a replaceable part selected from the one or more parts for monitoring;

the accumulated operation amount information of the replaceable part;

cost of the replaceable part;

extent of contribution to power consumption reduction due to replacement of the replaceable part; and the amount of electric power consumed by the replaceable part.

14. A method of monitoring power consumption of an image forming apparatus having one or more parts selected for monitoring, the one or more parts being internal components of the image forming apparatus, the method comprising:

generating, for each one of the parts, accumulated operation amount information based on an operation state of the part, the accumulated operation amount information being a metric of an accumulated amount of wear that the part has been subjected to since the part was installed in the image forming apparatus;

obtaining, for each one of the parts, part-specific power consumption information using the generated accumulated operation amount information for the part and an estimate of an amount of electric power consumed by the part, the part-specific power consumption information indicating an amount of electric power consumed by the part; and providing a user, through a user interface, with power consumption information generated based on the part-specific power consumption information obtained for each one of the parts, the power consumption information indicating an amount of electric power consumed by one or more of the one or more parts that are internal components of the image forming apparatus.

15. A recording medium storing a plurality of instructions which cause a processor to perform a method of monitoring power consumption of an image forming apparatus having one or more parts selected for monitoring and a memory, the one or more parts being internal components of the image forming apparatus, the method comprising:

generating, for each one of the parts, accumulated operation amount information based on an operation state of the part, the accumulated operation amount information being a metric of an accumulated amount of wear that the part has been subjected to since the part was installed in the image forming apparatus;

obtaining, for each one of the parts, part-specific power consumption information using the generated accumulated operation amount information for the part and an estimate of an amount of electric power consumed by the part, the part-specific power consumption information indicating an amount of electric power consumed by the part; and providing a user, through a user interface, with power consumption information generated based on the part-specific power consumption information obtained for each one of the parts, the power consumption information indicating an amount of electric power consumed by one or more of the one or more parts that are internal components of the image forming apparatus.

16. The image forming apparatus of claim 1, wherein the controller is configured to obtain the part-specific power consumption information using one of a table and a formula that relates the generated accumulated operation amount information and the estimate of the amount of electric power consumed by the part.

17. The method of claim 14, wherein the obtaining part-specific power consumption information includes using one of a table and a formula that relates the generated accumulated operation amount information and the estimate of the amount of electric power consumed by the part.

18. The recording medium of claim 15, wherein the obtaining part-specific power consumption information includes using one of a table and a formula that relates the generated accumulated operation amount information and the estimate of the amount of electric power consumed by the part.

* * * * *